(12) United States Patent
Mikubo et al.

(10) Patent No.: US 7,420,807 B2
(45) Date of Patent: Sep. 2, 2008

(54) COOLING DEVICE FOR ELECTRONIC APPARATUS

(75) Inventors: Kazuyuki Mikubo, Tokyo (JP); Sakae Kitajo, Tokyo (JP); Yasuhiro Sasaki, Tokyo (JP); Atsushi Ochi, Tokyo (JP); Mitsuru Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 197 days.

(21) Appl. No.: 10/524,770

(22) PCT Filed: Aug. 18, 2003

(86) PCT No.: PCT/JP03/10419

§ 371 (c)(1),
(2), (4) Date: Feb. 15, 2005

(87) PCT Pub. No.: WO2004/017698

PCT Pub. Date: Feb. 26, 2004

(65) Prior Publication Data

US 2005/0231914 A1    Oct. 20, 2005

(30) Foreign Application Priority Data

Aug. 16, 2002  (JP) ............................. 2002-237256

(51) Int. Cl.
*H05K 7/20* (2006.01)

(52) U.S. Cl. .................... 361/699; 361/695; 361/968; 361/700; 165/80.3; 165/80.4; 165/104.26; 165/104.28

(58) Field of Classification Search ................ 361/687, 361/695, 698–701, 704–711; 165/80.3, 80.4, 165/106.33, 185, 104.31–106.26; 257/714, 257/715, 721–722; 176/15.1, 16.3; 62/259.2
See application file for complete search history.

(56) References Cited

U.S. PATENT DOCUMENTS 5,057,908 A    10/1991    Weber (Continued)

FOREIGN PATENT DOCUMENTS

JP    61-12246    1/1986

(Continued)

OTHER PUBLICATIONS

Chinese Office Action dated Dec. 7, 2007.

*Primary Examiner*—Michael Datskovskiy
(74) *Attorney, Agent, or Firm*—Sughrue Mion, PLLC

(57) ABSTRACT

The present invention provides a cooling apparatus which is easy to build and to fix it to electronic devices, superior in thermal conduction and heat dissipation, and possible to make thin the total configuration of the apparatus. The liquid cooling unit 9 and the air cooling unit 12 are formed in a unit. A heat absorption surface 19 of the liquid cooling unit 9 is contacted or bonded to the heat generation component such as the CPU and the heat generator, which have the largest power consumption and also locally generate heat within a small area in the box 2. In the liquid cooling unit 9, a liquid cooling pump 14 composed of an electromagnetic pump is arranged for circulating the coolant in the flow path 10. The heat generated by the heat generation components such as CPU 6, heat generator 7, and the like is thermally diffused with heat conduction into the whole liquid cooling unit 9 by circulating the coolant with the liquid cooling pump 14.

25 Claims, 35 Drawing Sheets

U.S. PATENT DOCUMENTS

| | | |
|---|---|---|
| 5,105,430 A | 4/1992 | Mundinger et al. |
| 5,316,077 A * | 5/1994 | Reichard ............... 165/104.28 |
| 5,763,951 A * | 6/1998 | Hamilton et al. ............ 257/714 |
| 5,864,466 A * | 1/1999 | Remsburg ................... 361/700 |
| 6,019,165 A * | 2/2000 | Batchelder ................ 165/80.3 |
| 6,062,302 A * | 5/2000 | Davis et al. ............ 165/104.26 |
| 6,263,957 B1 * | 7/2001 | Chen et al. ................. 165/80.4 |
| 6,477,045 B1 * | 11/2002 | Wang .......................... 361/700 |
| 6,648,064 B1 * | 11/2003 | Hanson ....................... 165/120 |
| 6,713,942 B2 * | 3/2004 | Raman et al. .......... 310/316.01 |
| 6,894,899 B2 * | 5/2005 | Wu et al. .................... 361/699 |
| 6,945,315 B1 * | 9/2005 | Gektin et al. .............. 165/80.4 |
| 7,031,155 B2 * | 4/2006 | Sauciuc et al. ............. 361/695 |
| 7,032,392 B2 * | 4/2006 | Koeneman et al. ........... 62/77 |
| 2003/0039097 A1 * | 2/2003 | Igarashi ..................... 361/687 |
| 2003/0205363 A1 * | 11/2003 | Chu et al. .................. 165/80.3 |

FOREIGN PATENT DOCUMENTS

| | | |
|---|---|---|
| JP | 63-138799 A | 6/1988 |
| JP | 6-127486 A | 5/1994 |
| JP | H06-310889 A | 11/1994 |
| JP | H07-322640 A | 12/1995 |
| JP | H08-186388 A | 7/1996 |
| JP | 10-209356 A | 8/1998 |
| JP | 11-163237 A | 6/1999 |
| JP | 2000-286579 A | 10/2000 |
| JP | 2001-24372 A | 1/2001 |
| JP | 2001-133174 A | 5/2001 |
| JP | 2001133174 A * | 5/2001 |
| JP | 2002-94276 A | 3/2002 |
| JP | 2002-151638 A | 5/2002 |
| WO | WO 92/19027 A1 | 10/1992 |

* cited by examiner

A—A' cross section

A-A' cross section

A-A' cross section

A−A' cross section

COOLING DEVICE FOR ELECTRONIC APPARATUS

FIELD OF THE INVENTION

The present invention relates to a cooling apparatus for electronic device, and, more particularly to the cooling apparatus for electronic device suitable for cooling a heat generation component such as a CPU and the like mounted on, for example, a laptop computer.

All of patents, patent applications, patent publications, scientific articles and the like, which will hereinafter be cited or identified in the present application, will hereby be incorporated by references in their entirety in order to describe more fully the state of the art, to which the present invention pertains.

DESCRIPTION OF THE RELATED ART

Recently, with an increase in processing volume and processing speed, a heat generator having a large power consumption such as a CPU and the like is mounted on electronic devices such as, for example, a PC. An amount of heat generated by the heat generator is increasing linearly. On the other hand, operation temperatures of various electronic components used in the electronic devices are limited in general in view of thermal reliability and temperature dependence of the operation characteristics. Therefore, it has been an urgent matter for these electronic devices to establish technologies for effectively exhausting heat, which is generated within the devices, out of the devices.

Generally, in the electronic devices such as a PC and the like, for example, a metallic heat-sink or, so called, a heat-pipe has been attached to a CPU and the like for diffusing the heat to a whole body of the electronic devices by thermal conduction, or an electromagnetic cooling fan has been disposed on the body for exhausting the heat to the outside of the electronic devices thereof.

However, for example, in a laptop PC and the like which is packaged in high-density with electronic components, a heat discharging space within the electronic device is limited. Then, regarding a CPU with power consumption over 30 W, it has been difficult to sufficiently discharge the internal heat to the outside of the device, although a conventional cooling fan or a combination of the cooling fan and the heat pipe has a proper cooling performance for the CPU with power consumption around 30 W.

A cooling fan having a large blowing performance has also been essential, and in the case of the electromagnetic fan, calmness of the fan has been lacked by noises generated by, for example, a wind roar of rotating blades.

In addition, regarding a PC for a server, demands for compactness and calmness has become strong with increase in the penetration rate of the PC. Accordingly, the same issue with a laptop PC in regard to the heat dissipation has been existed as well.

Cooling apparatuses of conventional electronic devices disclosed in the Japanese laid-on patent applications, No. 2002-94276 and No. 2002-94277 have been developed as methods to solve the above issues.

FIG. 1 is a traverse cross sectional view showing an arrangement of a conventional cooling apparatus for electronic devices.

As shown in FIG. 1, the conventional cooling apparatus comprises a heat-sink 101, a heat-discharge pipe 102 for thermal conduction, and an enforced cooling member 104. The heat-sink 101 has a heat sinking part therein contacting with a high power consumption device such as a CPU and the like. A liquid flow path 105 is formed in the heat-sink 101. The liquid flow path 105 is connected to the enforced cooling unit 104 through the heat-discharge pipe 102. The enforced cooling unit 104 acts as a heat-discharge unit. The enforced cooling unit 104 comprises a liquid circulation pump 106, an air cooling fan 103, and a housing 107 containing the liquid circulation pump 106 and the air cooling fan 103 therein. All of these are unified via a gasket.

A heat generated by a device with high power consumption is transferred to the heat-sink 101 which is contacted to the device, and thereby increases a temperature of liquid in the liquid flow path 105 within the heat-sink 101. The liquid in the liquid flow path 105 is carried to the enforced cooling unit 104 through the heat-discharge pipe 102 by a pressure generated by the liquid circulation pump 106. In the enforced cooling unit 104, the liquid which is raised the temperature in the liquid flow path 105 is cooled by the air cooling fan 103, and thereby the temperature is decreased. The liquid of which temperature is decreased returns to the heat-sink 101 by circulation. On the other hand, an air within the enforced cooling unit 104, which is raised its temperature through cooling the liquid in the enforced cooling unit 104, is exhausted outside of the housing unit 107 by the air cooling fan 103.

However, the conventional cooling apparatus comprises the heat-sink 101, the enforced cooling unit 104 as a heat-discharge unit, and a heat-discharge pipe 102 connecting the both. In addition, the apparatus further comprises, for example, a pump cover and a heat-sink cover. Then, assembly and fixing of the apparatus to an electronic device body are complex. Furthermore, since a setting position of the air cooling unit having a fan is limited to the vicinity of the enforced cooling unit 104 in which the liquid circulation pump 106 is set, the cooling performance has been not sufficient.

In addition, since a conventional cooling apparatus is equipped with the liquid circulation pump 106 for the enforced air cooling, a pump unit has become large and complex compared with that of pump itself, thereby the total configuration of the apparatus has been thick.

Furthermore, since the conventional cooling apparatus is built with a resin gasket, the coolant of the apparatus has been lost bit by bit by leaking outside of the apparatus during long use, and thereby the cooling performance has been degraded.

DISCLOSURE OF THE INVENTION

Under the status described in the above, a development of a cooling apparatus for electronic devices, which is free from the above issues, has been expected.

It is therefore an object of the present invention to provide a cooling apparatus for electronic devices which is free from the above issues.

It is another object of the present invention to provide a cooling apparatus for electronic devices which is easy to build and to fix it to electronic devices, superior in thermal conduction and heat dissipation, and possible to make thin the total configuration of the apparatus.

The present invention provides a cooling apparatus for cooling a heat generator in electronic devices comprising a liquid cooling unit discharging heat generated by the heat generator with coolant, and an air cooling unit having a cooling fin group for exhausting heat discharged by the liquid cooling unit in atmosphere, wherein the air cooling unit is stacked onto the liquid cooling unit.

The liquid cooling unit may comprise a heat absorption surface absorbing heat by one of method of contacting and joining with the heat generator, a flow path, in which the coolant flows, formed along the heat absorption surface, and a liquid cooling pump for circulating the coolant within the flow path.

The flow path may be formed by joining a base having a groove and the heat absorption surface.

The air cooling fin group and the base may be formed in a unit.

The flow path may be formed within at least one of a fin among a plurality of fins composing the air cooling group.

The air cooling unit may comprise an air cooling fan for flowing air to the air cooling fin group The air cooling unit may comprise a first air channel totally covering the air cooling fin group, wherein an air flow generated by the air cooling fan is controlled by the first air channel.

At least one air hole for supplying air to the air cooling unit may be formed in the liquid cooling unit.

The air cooling fin group may be divided into a plurality of groups, wherein the air hole supplying air to the air cooling fin group is formed for each plurality of groups of the air cooling fin group in the liquid cooling unit.

The air cooling unit may further comprise a second air channel covering each plurality of groups of the air cooling fin group, wherein an air flow generated by the air cooling fan is controlled by the second air channel for not to thermally interfering among the plurality of groups of the air cooling unit.

The air cooling unit further may comprise an air cooling fan in each second air channel.

The air cooling unit may comprise a first air channel totally covering the air cooling fin group, a second air channel covering each plurality of groups of the air cooling fin group, a common air flow path formed by the first air channel, and a plurality of individual air flow paths formed by the plurality of second flow paths.

The air cooling unit may comprise an air cooling fan arranged in the common air flow path, wherein an air flow is generated in each individual air flow path by the air cooling fan.

A cross section area of an aperture at a border between the individual air flow path and the common air flow path may be formed to become larger according the distance from the air cooling fan so that a volume of air flow in the individual air flow path becomes equal.

The air cooling unit may comprise a piezoelectric material supported by a support member and an air blow plate, which is bonded to the piezoelectric material, generating air flow through vibration thereof by controlling voltage of the piezoelectric materials.

A shape of the air blow plate may be formed to become wider with leaving from the piezoelectric material.

The air blow plate may comprise a first part having a first elastic constant located at closer side to the piezoelectric material and a second part having a second elastic constant, which is higher than the first elastic constant, located at more distant side from the piezoelectric material.

The air blow plate may comprise a first part having a first thickness located at closer side to the piezoelectric material and a second part having a second thickness, which is thicker than the first thickness, located at more distant side from the piezoelectric material.

The air cooling unit is characterized in that a plurality of piezoelectric fans are arranged along air flow, and the each piezoelectric fan adjacently arranged to each other is driven by shifting a vibration phase of the air blow plate of piezoelectric fan by ½ cycle or ¼.

The flow path may be a closed loop with a circulation method, in a part of the closed loop, wherein a micro channel structure having a smaller cross section area than a cross section area of the flow path may be formed.

The micro channel structure may be formed by joining a base arranging a plurality of narrow grooves and the heat absorption surface.

The liquid cooling unit may comprise a piezoelectric pump having a platy piezoelectric element as a driving source, wherein the coolant is circulated by the piezoelectric pump.

The piezoelectric pump may comprise a stacked plate structure having a check valve of plate vane structure for controlling a flow direction of the coolant.

The piezoelectric pump may be built into the liquid cooling unit, wherein the piezoelectric pump and the liquid cooling unit are integrated in a unit with metal material.

The piezoelectric pump may comprise a plurality of pump members for introducing and exhausting the coolant and a plurality of piezoelectric pump driving members for driving the plurality of pump members.

The plurality of piezoelectric pump driving members may control timings of introduction and exhaust of the coolant of the plurality of pump members in different timing to each other.

The piezoelectric pump driving member may conduct an exhaust more than two times longer than an introduction of the pump member.

The liquid cooling unit may comprise a piezoelectric pump having a toric piezoelectric actuator as a driving source, wherein the coolant is circulated by the piezoelectric pump.

The liquid cooling unit may comprise an evaporation-method pump circulating the coolant with evaporation of the coolant by a heat generator.

The evaporation-method pump may comprise a plurality of heat generators, wherein a flow direction of the coolant is determined by controlling heat generation timing of the plurality of heat generators.

The cooling apparatus may further comprise an air cooling fan supplying air to a liquid cooling pump for circulating the coolant and to the air cooling fin group, and an electric control circuit driving the liquid cooling pump and the air cooling fan, wherein an input to the electric control circuit is DC current.

The electric control circuit may input information about a temperature of the heat generator, wherein the liquid cooling pump and the air cooling fan are driven so as to maintain at maximum temperature within an upper limit of the heat generator.

In addition, the present invention provides an electronic device mounting a cooling apparatus fabricated according to any one of claims 1 to 25.

PREFERRED EMBODIMENTS OF THE PRESENT INVENTION

Embodiments of the present invention will be explained in detail by referring figures.

Figure 1:
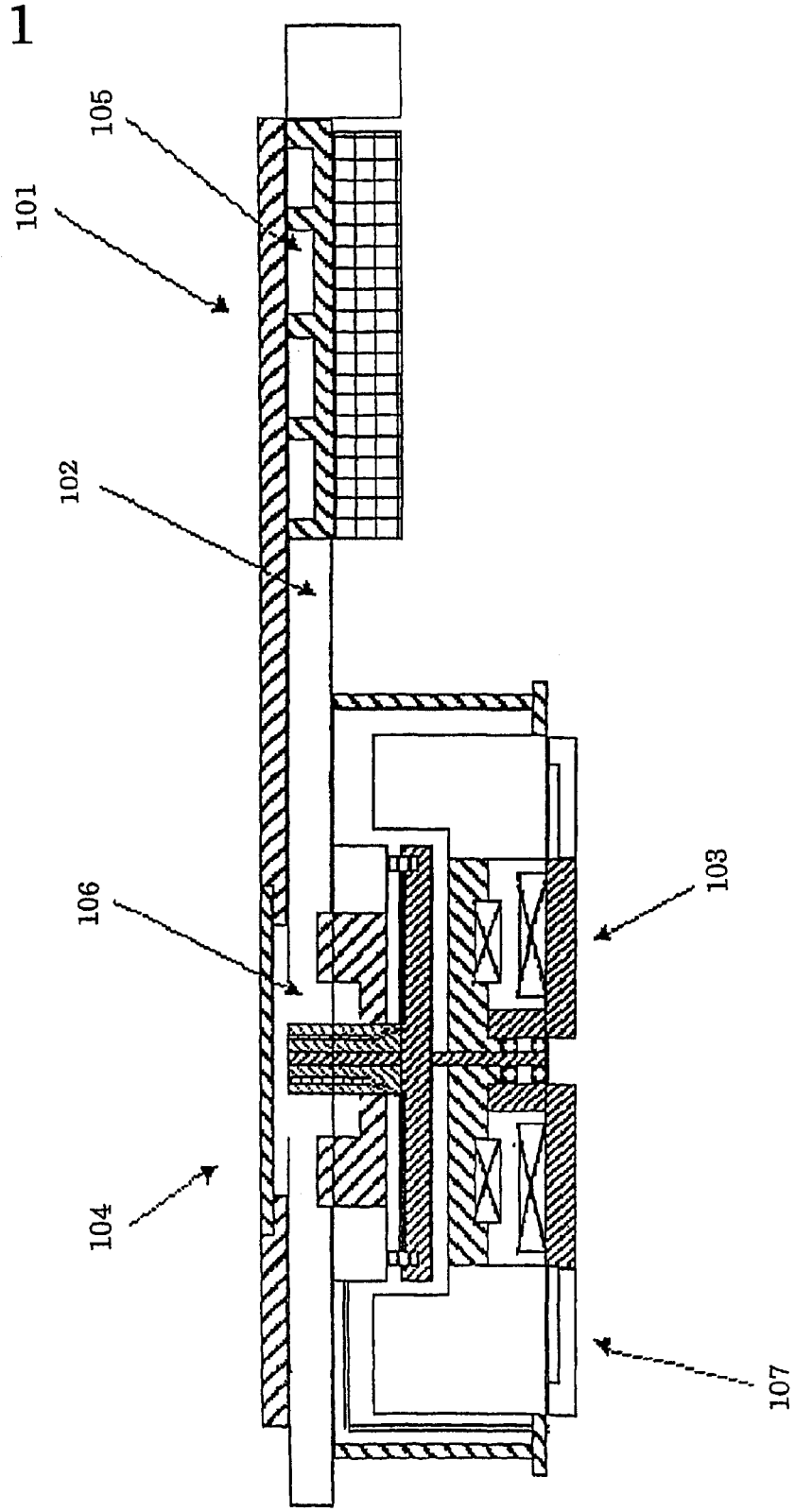
FIG. 1 is a traverse cross sectional view showing a configuration of a conventional cooling apparatus for electronic devices.
Figure 2A:
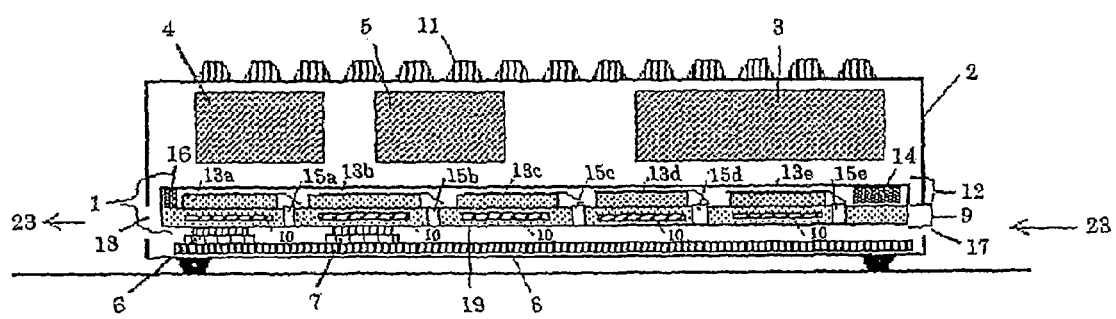
FIG. 2A is a cross sectional view showing a cooling apparatus which is built in electronic devices in the preferred embodiment of the present invention.
Figure 2B:
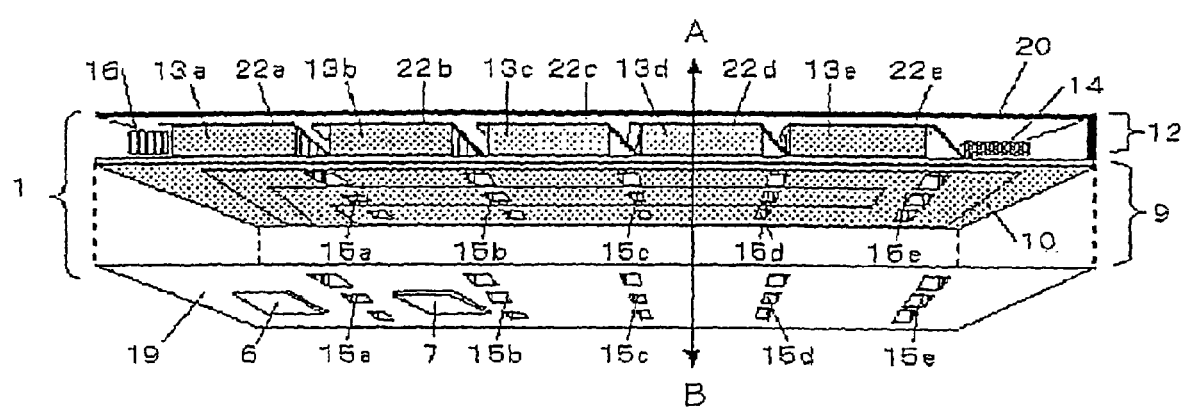
FIG. 2B is a perspective view looked from back side of a cooling apparatus shown in FIG. 2A.
Figure 2C:
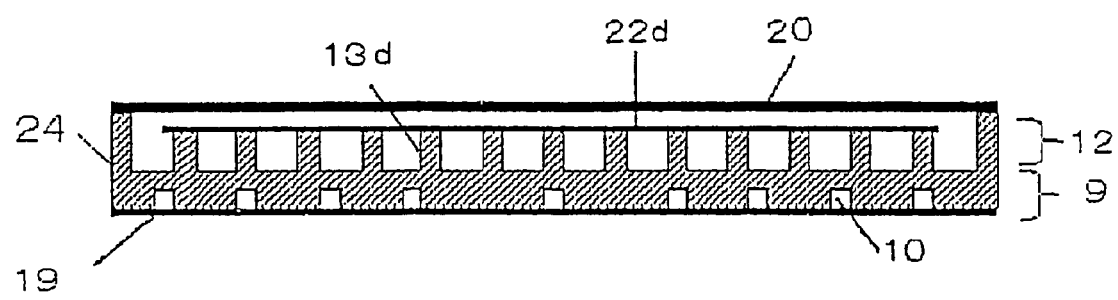
FIG. 2C is a cross sectional view cut at A-B line shown in FIG. 2B.

FIG. 2A is a cross sectional view showing a configuration of a cooling apparatus fixed in electronic devices in the preferred embodiment of the present invention. FIG. 2B is a perspective view looked from backside of a cooling apparatus shown in FIG. 2A. FIG. 2C is a cross sectional view cut at A-B line shown in FIG. 2B A note type personal computer (hereinafter, referred to as note PC) is picked up for explanation as a typical electronic device for mounting a cooling apparatus for electronic devices of this embodiment. However, applications of the cooling apparatus for electronic devices of the embodiment is not limited to the note PC, but also applicable to an apparatus which generates heat by operation. In the note PC, as shown in FIG. 2A, a CD-ROM 3, PC card 4, HDD 5, a CPU 6 which locally generates heat, and a heat generator 7, for example, chip set and the like are mounted on a mother board 8. The mother board is put in a box 2 of which an outside thickness is 3 to 4 cm. That is, a plurality of electronic components is mounted within a small space limited by the box 2. Meanwhile, a keyboard 11 and, although not shown, a display such as a LCD and the like are arranged on the outside of the body 2.

As shown in FIGS. 2A, 2B, and 2C, a cooling apparatus 1 for electronic devices in this embodiment comprises a liquid cooling unit 9 and an air cooling unit 12. The liquid cooling unit 9 and the air cooling unit 12 are formed in a unit. Among electronic components mounted in the box 2, a component which has the largest power consumption and also locally generates heat within a small area is a heat generation component such as the CPU 6 and the heat generator 7. A heat absorption surface 19 of the liquid cooling unit 9 is contacted or bonded to the heat generation component such as the CPU and the heat generator. The heat absorption surface may be formed, for example, with a cap. For explaining a flow path 10 within the liquid cooling unit 9, FIG. 2B shows a status that the heat absorption surface (i.e., metal cap) 19 is taken off. Practically, the surface is being bonded and sealed for forming a cap at lower side of the cooling apparatus 1.

In the liquid cooling unit 9, the flow path 10 in which a coolant such as water, an antifreeze liquid and the like flows, is disposed along the heat absorption surface (i.e., metal cap) 19. As shown in FIG. 2C, the flow path 10 is formed with a space confined by bonding the heat absorption surface (i.e., metal cap) 19 to a lower surface of a base 24, which is formed grooves thereon. The flow path 10 is filled with the coolant. The base 24 and the heat absorption surface (i.e., metal cap) 19 are made of metal having a high conductivity, for example, Cu, Al. Heat generated by the CPU 6, the heat generator 7 and the like is transferred to the coolant in the flow path 10 and the base 24 through the heat absorption surface (i.e., metal cap) 19. The heat absorption surface (i.e., metal cap) 19 is bonded to the base 24 of the liquid cooling unit 9 using one of the methods of, for example, diffusion bonding (i.e., brazing), pressure welding, and bonding with O-ring. 9

In the liquid cooling unit 9, a liquid cooling pump 14 which is composed of an electromagnetic pump is arranged for circulating the coolant in the flow path 10. The heat generated by the heat generation components such as CPU 6, heat generator 7, and the like is thermally diffused with heat conduction into the whole liquid cooling unit 9 by circulating the coolant with the liquid cooling pump 14.

A plurality of air vents 15a~15e which pass through the heat absorption surface (i.e., metal cap) 19 and the liquid cooling unit 9, and reaches to the air cooling unit 12, are disposed in the liquid cooling unit 9. The plurality of air vents 15a~15e are located at positions escaping from the flow path 10. Cooled air 23 is introduced into the box 2 through an air introduction vent 17 which is disposed in the box 2, and supplied to the air cooling unit 12 through the air vents 15a~15e According to FIGS. 2A, 2B, and 2C, in the air cooling unit 12, air cooling fin groups 13a~13e made of high conductivity material such as Cu and Al, an air cooling fan 16 for discharging heat of the air cooling fin groups 13a~13e in atmosphere around the fin groups, an air cooling fan cover (air channel 1) 20 for covering an upper surface of the air cooling fin groups 13a~13e to avoid decrease in the cooling performance by dispersing the cooled air 23 from the air cooling unit 12 to the vicinity, and fin covers (air channel 2) 22a~22e forming a flow path of the cooled air 23 for each air cooling fin group 13a~13e for avoiding heat exchange between the air cooling fin groups 13a~13e to each other. The air cooling fin groups 13a~13e of the air cooling unit 12 and the base 24 of the liquid cooling unit 9 are formed in a unit with metal such as Cu and Al, thereby the heat from the liquid cooling unit 9 is effectively transferred to the air cooling unit 12.

The heat generated by the CPU 6, the heat generator 7, and the like is thermally diffused into the whole liquid cooling unit 9 with thermal conduction of the coolant circulating in a closed unit after transferred by thermal conduction to the coolant circulating in the flow path 10 using a liquid cooling pump 14. The thermally diffused heat is also transferred to the air cooling fin groups 13a_13e of the air cooling unit 12. The heat transferred to the air cooling fin groups 13a~13e is further thermally exhausted outside of the box 2 by a cooled air flow 23 generated by the air cooling fan 16. That is, the cooled air 23 is dispersed into the air cooling fin groups 13a~13e through the air vents 15a~15e set in the liquid cooling unit 9 after introduced in the box 2 via an air introduction vent 17 disposed in the box 2. In addition, the cooled air 23 for each air cooling fin groups 13a~13e does not thermally interfere to each other and is thermally exhausted outside of the box 2 via an air exhaust vent 18 of the box 2 after passing through the air cooling fan 16.

For a desktop PC, which generally has a sufficient free space in the electronic device body, it is possible to cool a CPU 6 with power consumption around 25 W by natural cooling condition which has only the air cooling fin groups 13a~13e as the air cooling unit 12. However, in the electronic devices mounting electronic component with power consumption over 25 W within a small space such as the box 2 of this embodiment, the heat transferred to the air cooling fin groups 13a~13e is confined within the box 2, thereby an air cooling fan is needed to exhaust the heat outside of the box 2 for avoiding increase in temperature in the box 2.

Figure 4:
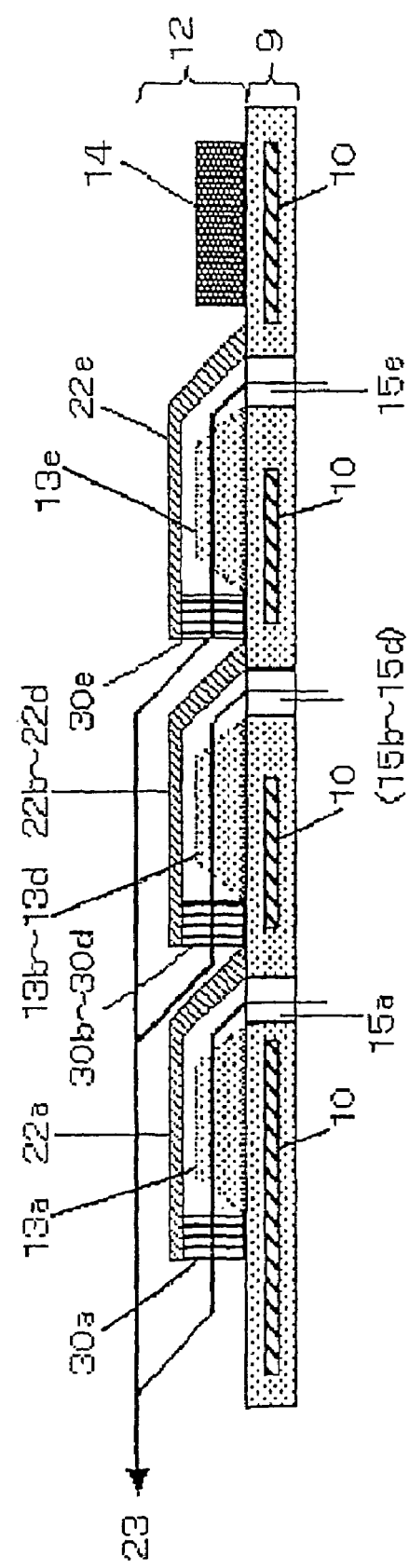
FIG. 4 is a traverse cross sectional view showing a practical configuration of a cooling apparatus shown in FIGS. 2A and 2B.
Figure 5:
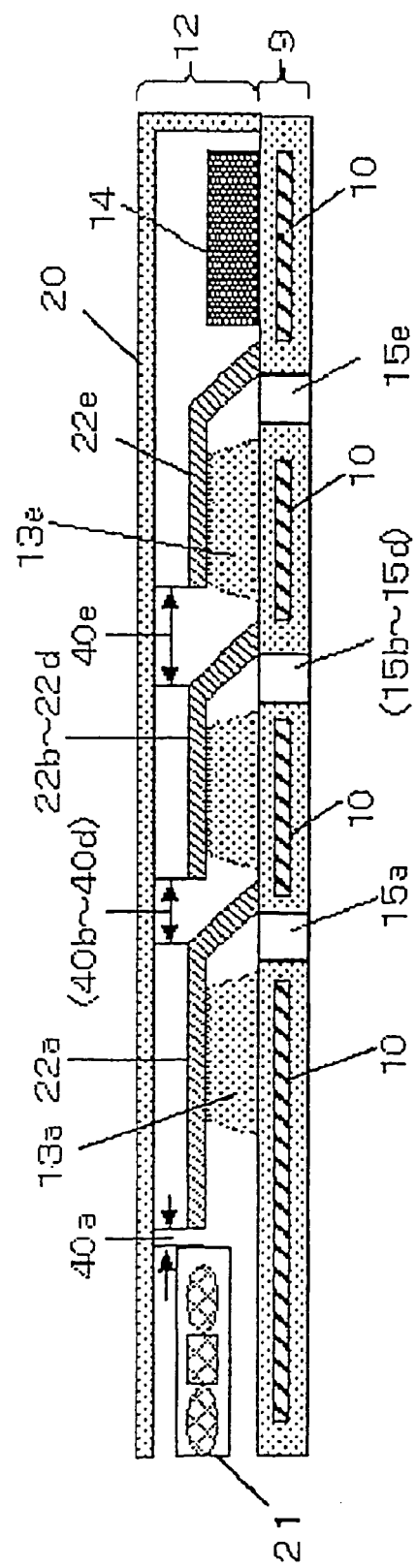
FIG. 5 is a traverse cross sectional view showing a practical configuration of a cooling apparatus shown in FIGS. 2A and 2B.

Next, a practical configuration of the air cooling unit 12 in the cooling apparatus 1 will be explained in detail referring to FIG. 3 to FIG. 5. FIGS. 3, 4 and 5 are traverse sectional views showing the practical configuration of the cooling apparatus in FIG. 2A and FIG. 2B.

Figure 3A:
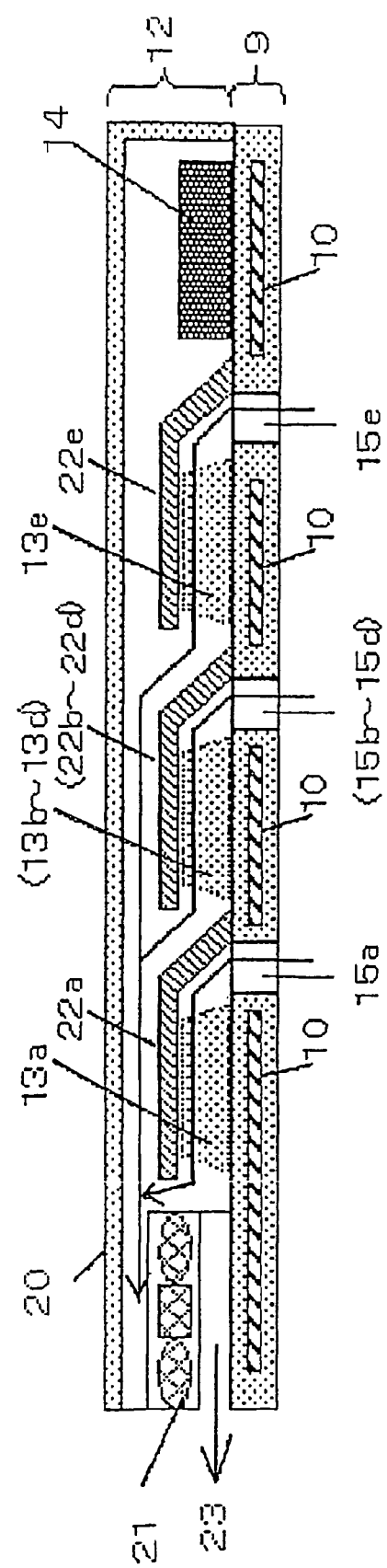
FIGS. 3A and 3B are traverse cross sectional views showing a configuration of a cooling apparatus shown in FIGS. 2A and 2B.
Figure 3B:
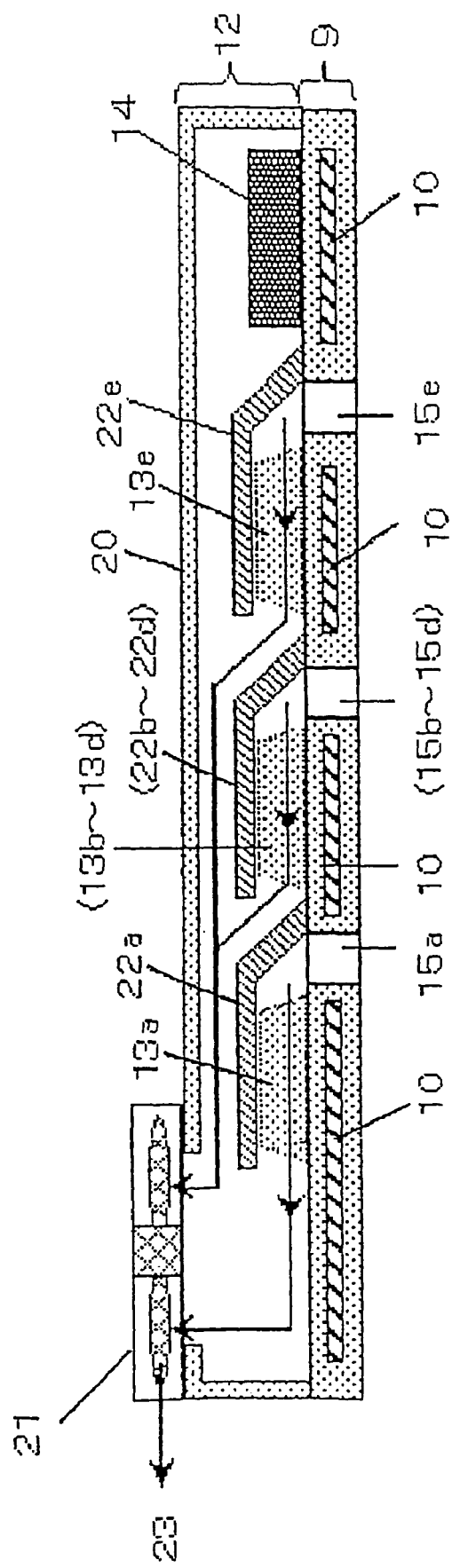

As an air cooling fan 16 shown in FIGS. 2A and 2B, a well known DC fan 21 can be used as shown in FIGS. 3A and 3B The DC fan 21 may be arranged in a space between the liquid cooling unit 9 and the air cooling fan cover (air channel 1) 20, if possible, as shown in FIG. 3A If it is not possible to arrange the DC fan 21 in the space between the liquid cooling unit 9 and the air cooling fan cover (air channel 1) 20, an arrangement of the DC fan 21 on the air cooling fan cover (air channel 1) 20 may be possible as an alternative as shown in FIG. 3B.

Furthermore, as the air cooling fan 16 shown in FIGS. 2A and 2B, as shown in FIG. 4 as an alternative, it may be possible to arrange internal air cooling fans 30a~30e in the vicinity of cooled air outlet of fan covers (air channel 2) 22a~22e of the air cooling unit 12. If an air flow of the cooled air 23 is formed by the internal air cooling fans 30a~30e, an arrangement of the air cooling fan cover (air channel 1) 20 is not necessary since the fan covers (air channel 2) 22a~22e act as the fan cover.

The air cooling fin groups 13a~13e of the air cooling unit 12 are consist of a plurality of divided fin groups for efficiently introducing the cooled air 23 flown into through a plurality of air vents formed in the liquid cooling unit 9. That is, each air cooling fin groups 13a~13e is supplied the cooled air 23 through each air vents 15a~15e, respectively. However, even through the air cooling fin groups 13a~13e are consist of the plurality of divided fin groups, each air cooling fin groups 13a~13e thermally interferes to each other by heat generation of the CPU 6 and heat generator 7. Then, the plurality of fan covers (air channel 2) 22a~22e are disposed corresponding to each air cooling fin groups 13a~13e for controlling an air flow of the cooled air 23 so that the cooled air 23 passing through each air cooling fin groups 13a~13e is not supplied to the other air cooling fin groups 13a~13e.

For the air flow of the cooled air 23 controlled by the air cooling fin groups 13a~13e and the fan covers (air channel 2) 22a~22e, the air cooling fan cover (air channel 1) 20 is disposed, which totally covers the air cooling unit 12 for avoiding dispersion of the cooled air 23 flowing in a common air flow path, for more efficiently exhausting the heat outside of the box 2 That is, the common air flow path is formed for the air flowing in the air cooling fin groups 13a~13e by the air cooling fan cover (air channel 1) 20, and also an individual air flow path, in which air passing through each air cooling fin groups 13a~13e flows, is formed by the fan covers (air channel 2) 22a~22e.

In addition, as shown in FIG. 5, if a gap between a fin cover 22a of an air cooling fin group 13a and a DC fan is named as a fin gap 40a, if a gap between the fin cover 22a and fin covers 22b~22d of the air cooling fin groups 13b~13d are named as fin gaps 40b~40d, and if gaps between the fin cover 22b~22d and a fin cover 22e of an air cooling fin group 22e is named as a fin gap 40e, the fin gaps 40b~40d are larger than the fin gap 40a, and also, the fin gap 40e is larger than the fin gaps 40b~40d. That is, the fin gaps 40a~40e and apertures opened to the common air flow path become larger with increasing a distance from the DC fan 21. That is, a volume of the cooled air 23, which is supplied through a plurality of air vents 15a~15e and flows in the air cooling fin groups 13a~13e existing in an individual air flow path formed by the fan covers (air channel 2) 22a~22e, is controlled by controlling an area of the aperture so that the volume of the cooled air 23 at each air cooling fin groups 13a~13e becomes equal, thereby controlling the pressure. Accordingly, a flow rate of the cooled air 23 passing through in the air cooling fin groups 13a~13e can be maintained constant.

A practical configuration of the liquid cooling unit 9 of the cooling apparatus 1 will be explained in detail by referring to FIG. 6 and FIG. 7.

Figure 6:
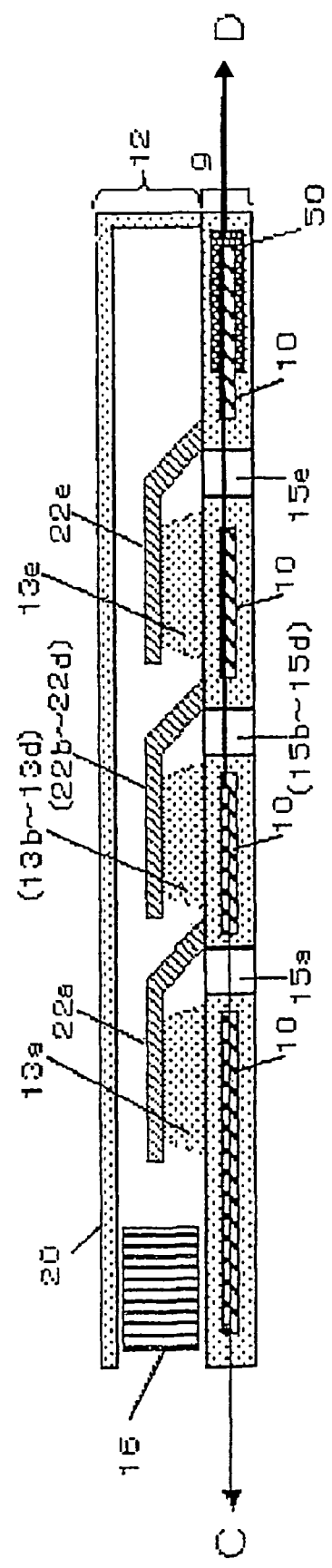
FIG. 6 is a traverse cross sectional view showing a practical configuration of a cooling apparatus shown in FIGS. 2A, 2B, and 2C.

FIG. 6 is a traverse sectional view showing a practical configuration of the cooling apparatus shown in FIGS. 2A, 2B and 2C. FIG. 7 is a top plane cross sectional view looked from upper side at C-D cross section of the liquid cooling unit of the cooling apparatus shown in FIG. 6.

Figure 7:
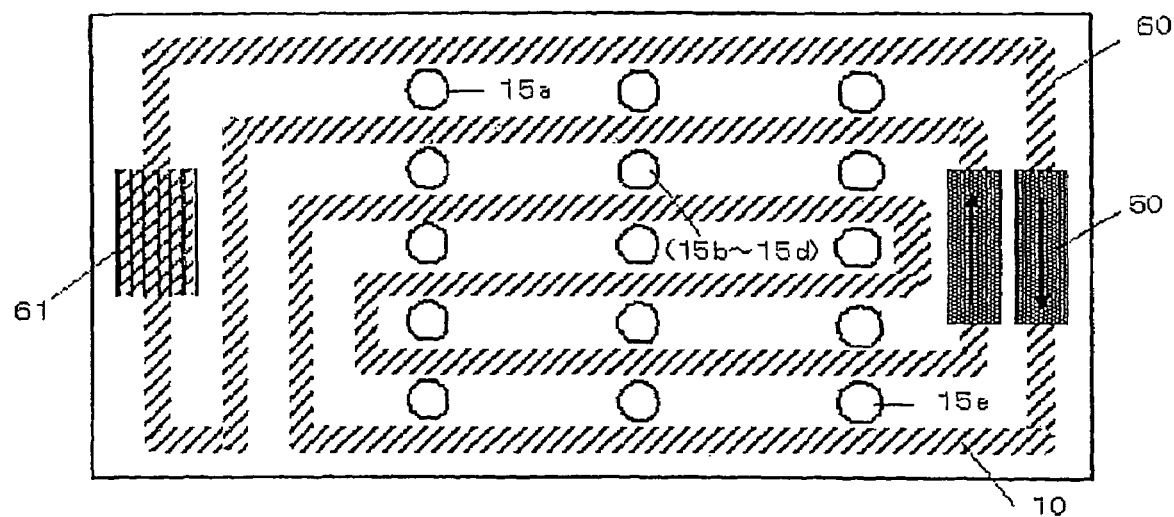
FIG. 7 is a top plane view looked from upper side at C-D line cross section of a liquid cooling unit of a cooling apparatus shown in FIG. 6.

A liquid cooling pump 14 of the liquid cooling unit 9 shown in FIGS. 2A, 2B and 2C may comprise a liquid driving pump 50 shown in FIGS. 6 and 7, which is disposed in a flow path 10 integrated with the air cooling fin groups 13a~13e. Using the liquid driving pump 50 disposed in the flow path 10, a coolant can be circulated within a small closed space without connecting the coolant in the flow path 10 and the liquid driving pump 50 by, for example, pipes.

As shown in FIG. 7, the flow path 10 comprises a loop flow path 60, which is closed with a circulation method. The loop flow path 60 is formed in a closed loop avoiding a plurality of air vents 15a~15e disposed in the liquid cooling unit 9, and has a thermal diffusing function to a whole cooling apparatus 1. In addition, for quickly transferring heat generated by the CPU 6 and the like, an area of the loop flow path 60 corresponding to the CPU 6 and the like is formed longer in width (i.e., up and bottom direction in FIG. 7) compared with that of the CPU 6 and the like.

As shown in FIG. 7, a micro channel 61 is disposed in the area corresponding to the CPU 6, which has the largest heat generation among the mounted electronic components. The micro channel 61 is located in the vicinity of absorption surface (i.e., metal cap) 19, and consist of a plurality of fine grooves of 1 mm or less in width, formed on a base 24. The micro channel 61 is composed of a plurality of fine flow paths which have smaller cross section than that of the loop flow path 60, thereby resulting in increase in heat exchange ratio by increasing in the flow rate of the micro channel 61. However, since the flow resistance is increased in the micro channel 61, it should be limited to the area around the CPU 6.

As a coolant in the loop flow path 60, a liquid, for example, water which has a large heat capacity per volume, is employed, thereby a heat dissipation performance can be increased drastically compared with the case where air or the like is used. In addition, by making the length of the loop flow path 60 longer than the CPU 6 size, a contacting area with the coolant circulating within the loop flow path 60 can be increased, thereby resulting in efficient heat transfer. However, if the contacting area is increased to more than necessary, a pressure loss due to the flow resistance is increased. If the pressure loss is beyond the capability of the liquid driving pump 50, the coolant does not circulate and the heat dissipation performance is decreased. Therefore, an optimum contacting area is employed considering the heat dissipation performance, the pressure loss, and the capability of the liquid driving pump 50

Next, an example of air cooling fin groups 13a~13e in which an air cooling fin group flow path 70 is disposed will be explained in detail by referring FIG. 8 and FIG. 9.

Figure 8:
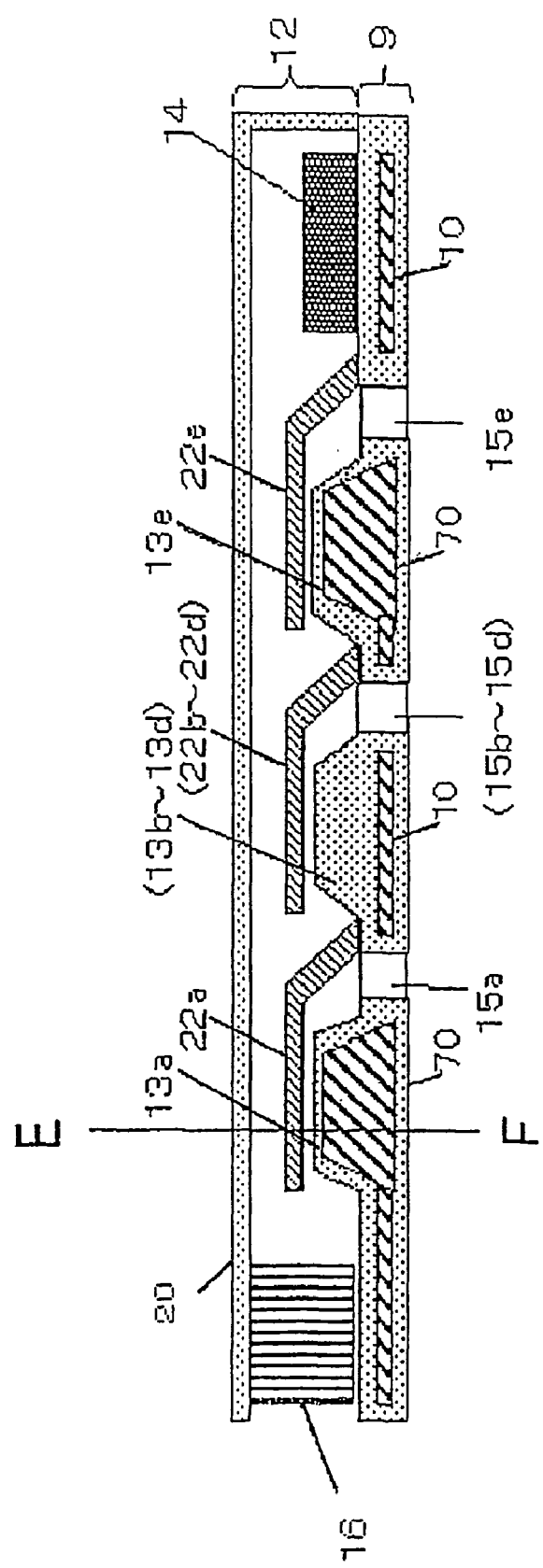
FIG. 8 is a traverse cross sectional view showing a configuration of an air cooling fin group flow path formed in an air cooling fin group shown in FIG. 2.
Figure 9A:
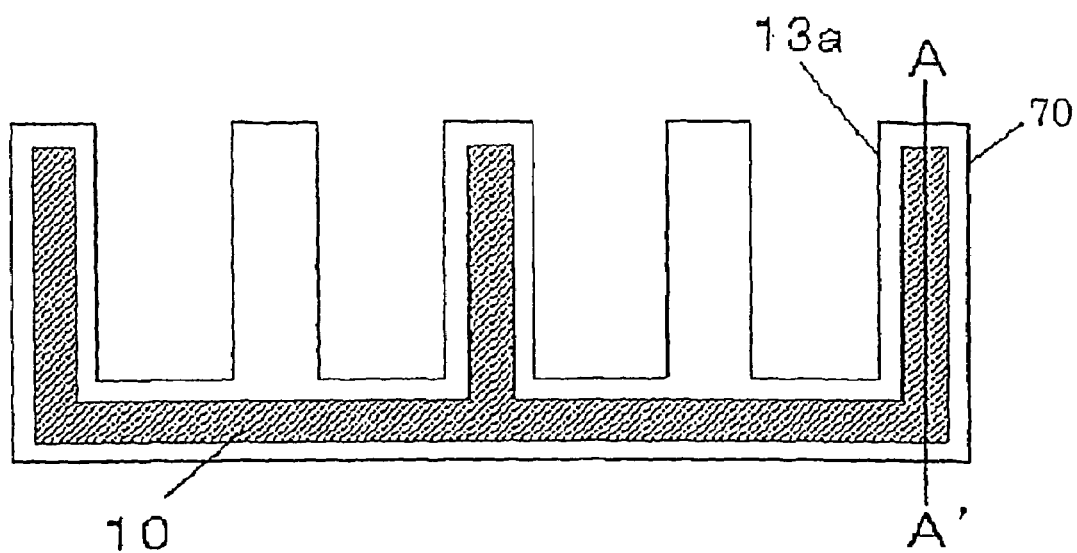
FIG. 9A is a partial cross sectional view showing a first example of structure at E-F cross section of an air cooling fin group flow path shown in FIG. 8.
Figure 9B:
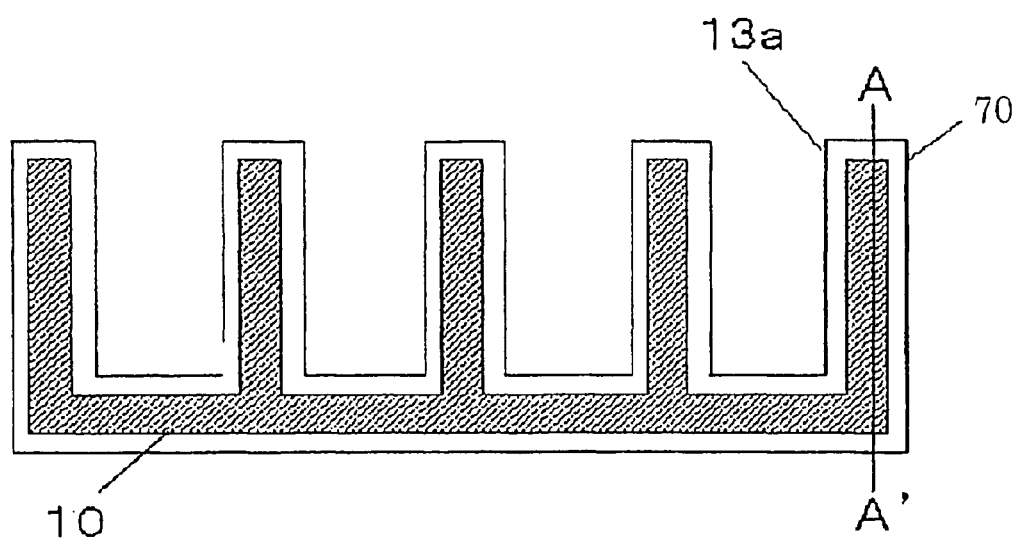
FIG. 9B is a partial cross sectional view showing a second example of structure at E-F cross section of an air cooling fin group flow path shown in FIG. 8.
Figure 9C:
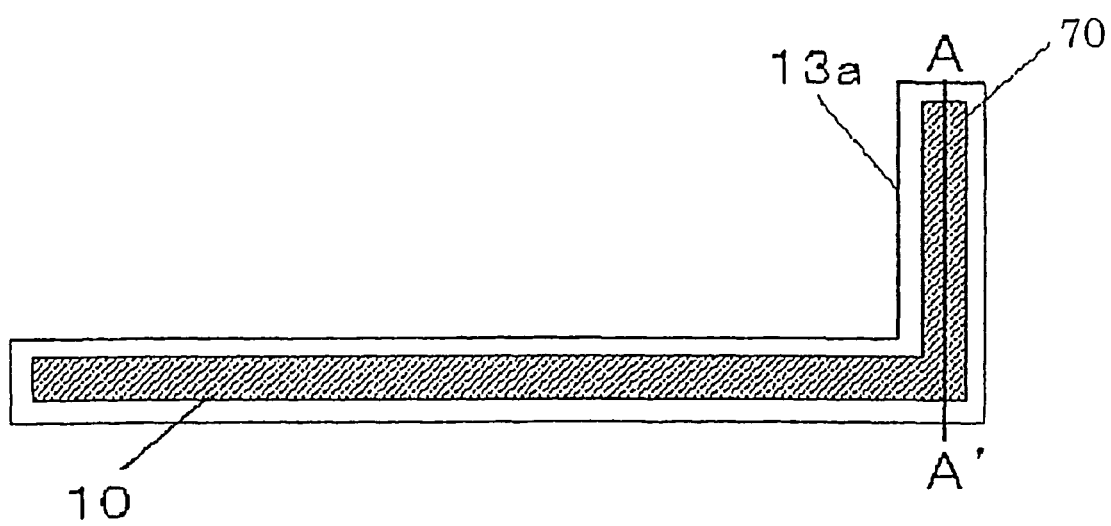
FIG. 9C is a partial cross sectional view showing a third example of structure at E-F cross section of an air cooling fin group flow path shown in FIG. 8.
Figure 9D:
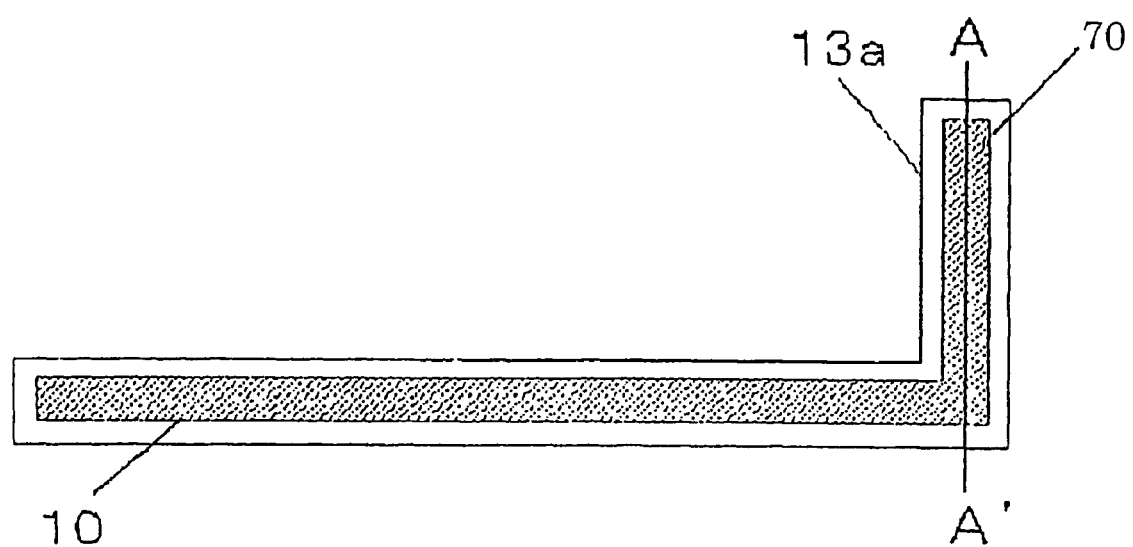
FIG. 9D is a partial cross sectional view showing a fourth example of structure at E-F cross section of an air cooling fin group flow path shown in FIG. 8.
Figure 10A:
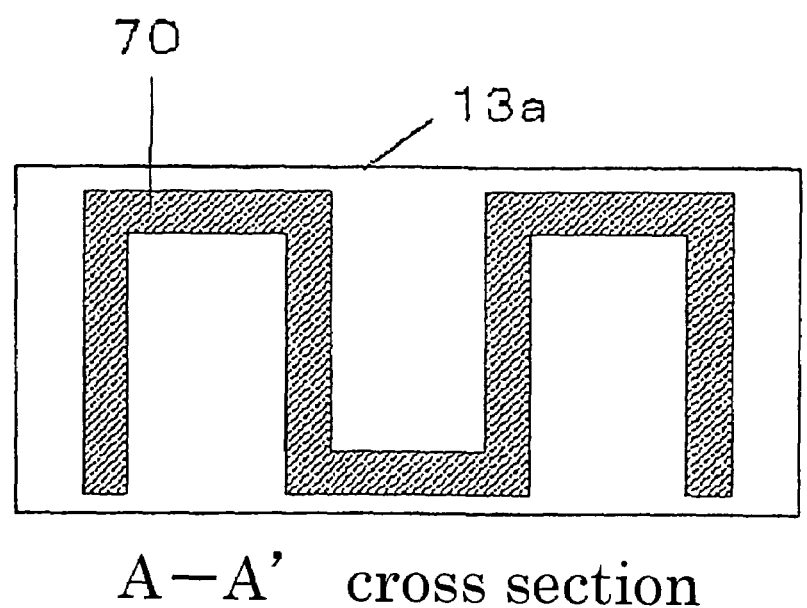
FIG. 10A is a partial cross sectional view showing a structure at A-A cross section of an air cooling fin group flow path shown in FIG. 9A.
Figure 10B:
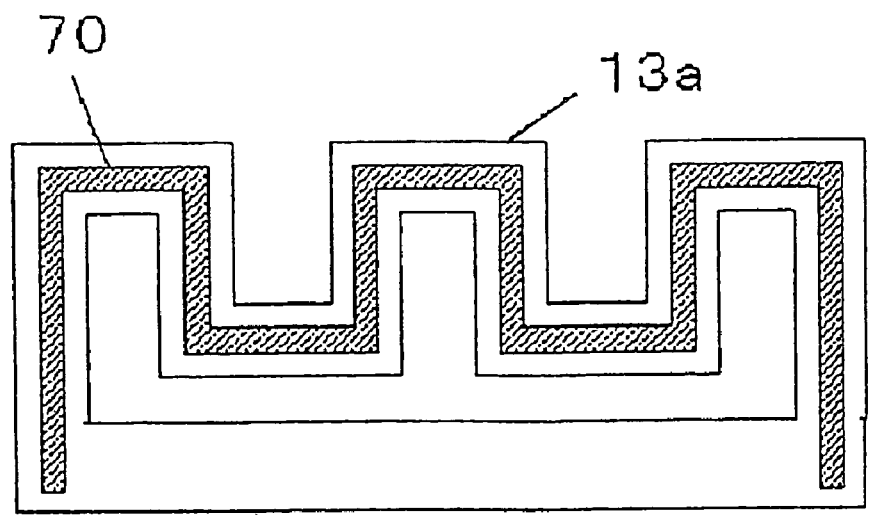
FIG. 10B is a partial cross sectional view showing a structure at A-A cross section of an air cooling fin group flow path shown in FIG. 9B.
Figure 10C:
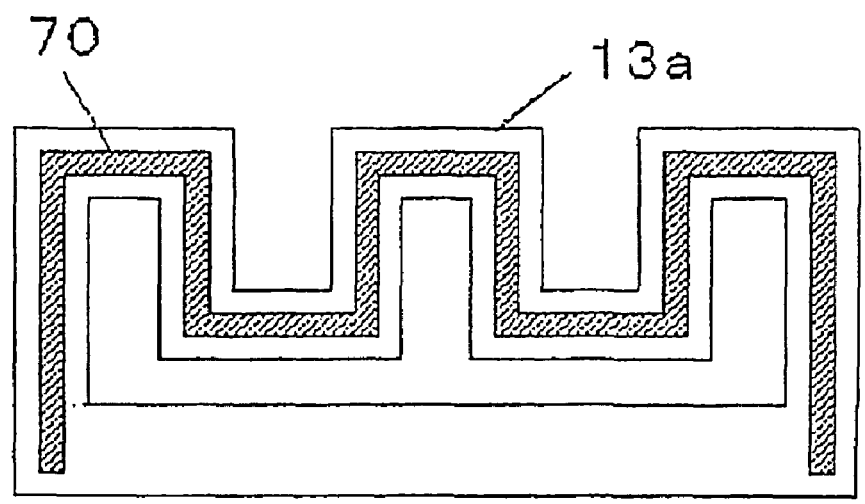
FIG. 10C is a partial cross sectional view showing a structure at A-A cross section of an air cooling fin group flow path shown in FIG. 9C.
Figure 10D:
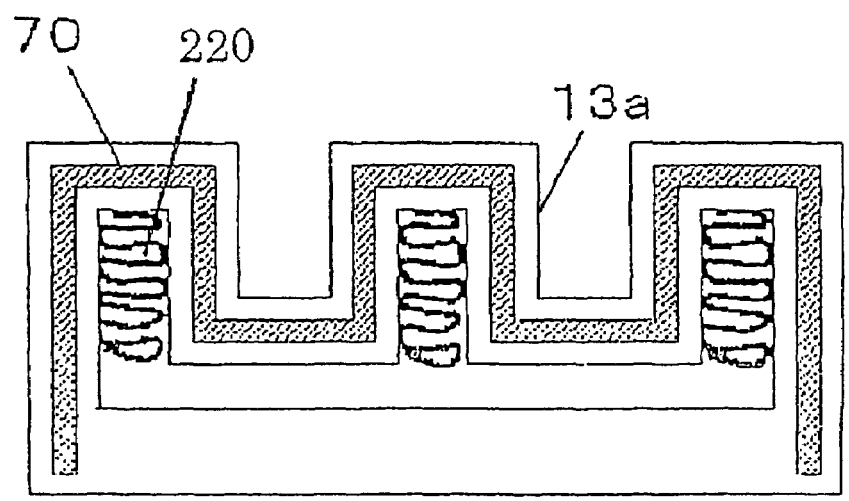
FIG. 10D is a partial cross sectional view showing a structure at A-A cross section of an air cooling fin group flow path shown in FIG. 9D.

FIG. 8 is a traverse cross sectional view showing a configuration of the air cooling fin group flow path disposed in the air cooling fin group shown in FIG. 2. FIG. 9A is a partial cross sectional view showing a first example of the configuration cut at E-F line of the air cooling fin group flow path shown in FIG. 8. FIG. 9B is a partial cross sectional view showing a second example of the configuration cut at E-F line of the air cooling fin group flow path shown in FIG. 8. FIG. 9C is a partial cross sectional view showing a third example of the configuration cut at E-F line of the air cooling fin group flow path shown in FIG. 8. FIG. 9D is a partial cross sectional view showing a fourth example of the configuration cut at E-F line of the air cooling fin group flow path shown in FIG. 8. FIG. 10A is a partial cross sectional view showing a configuration cut at A-A line of the air cooling fin group flow path shown in FIG. 9A. FIG. 10B is a partial cross sectional view showing a configuration cut at A-A line of the air cooling fin group flow path shown in FIG. 9B. FIG. 10C is a partial cross sectional view showing a configuration cut at A-A line of the air cooling fin group flow path shown in FIG. 9C. FIG. 10D is a partial cross sectional view showing a configuration cut at A-A line of the air cooling fin group flow path shown in FIG. 9D.

As shown in FIG. 8, an air cooling fin group flow path 70 in which a coolant flows is formed within at least one fin among a plurality of fins of the air cooling fin groups 13a~13e. If the air cooling fin group flow path 70 is formed within the air cooling groups 13a and 13e as shown in FIG. 8, the thermal discharging effect is increased because an encapsulated coolant such as water and the like circulates in the air cooling fin group 13a and 13e of the air cooling unit 12 as well as in the liquid cooling unit 9. The air cooling fin group flow path 70, as shown in FIG. 9A, may be formed within a part of the air cooling fin group 13a. The air cooling fin group flow path 70, as shown in FIG. 9B, may also be formed within all part of the air cooling fin group 13a. Furthermore, since the air cooling performance is increased with the air cooling fin group flow path 70, as shown in FIGS. 9C and 9D, the number of the air cooling fin group 13a may be decreased.

In addition, the air cooling fin group flow path 70 may be formed within a plate-like air cooling fin group 13a as shown a A-A' cross section in FIG. 10. The air cooling fin group flow path 70 may also be formed such that the flow path 70 itself acts as a air cooling fin group 13a as shown a A-A' cross section in FIG. 10B and a A-A' cross section in FIG. 10C. Furthermore, when the air cooling fin group flow path 70 is used as a air cooling fin group 13a, it is preferable to increase the air cooling performance by disposing a radiator structure formed with a metal net within a space of the air cooling fin group flow path 70 as shown a A-A' cross section in FIG. 10D.

A configuration of a piezoelectric fan available to use for an air cooling fan 16 will be explained in detail by referring to FIGS. 11, 12A, 12B, 13A, 13B, 14, 15A and 15B.

Figure 11:
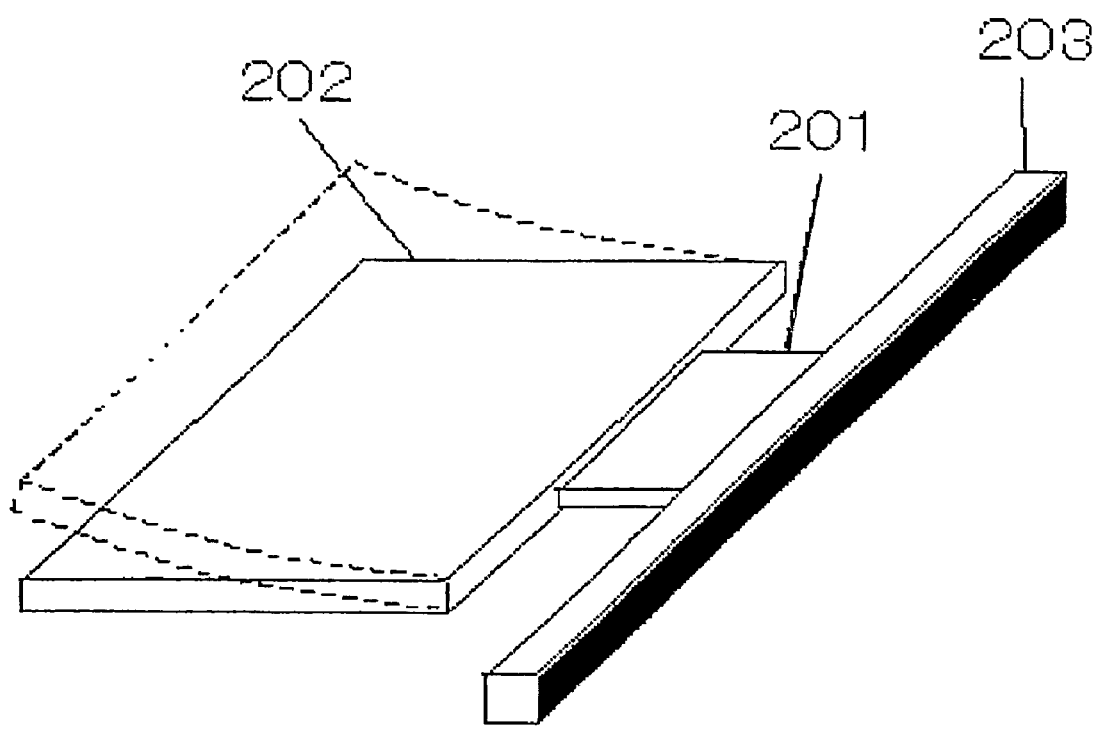
FIG. 11 is a perspective view showing a configuration of a piezoelectric fan for using as an air cooling fan of a cooling apparatus for electronic devices of the present invention.
Figure 12A:
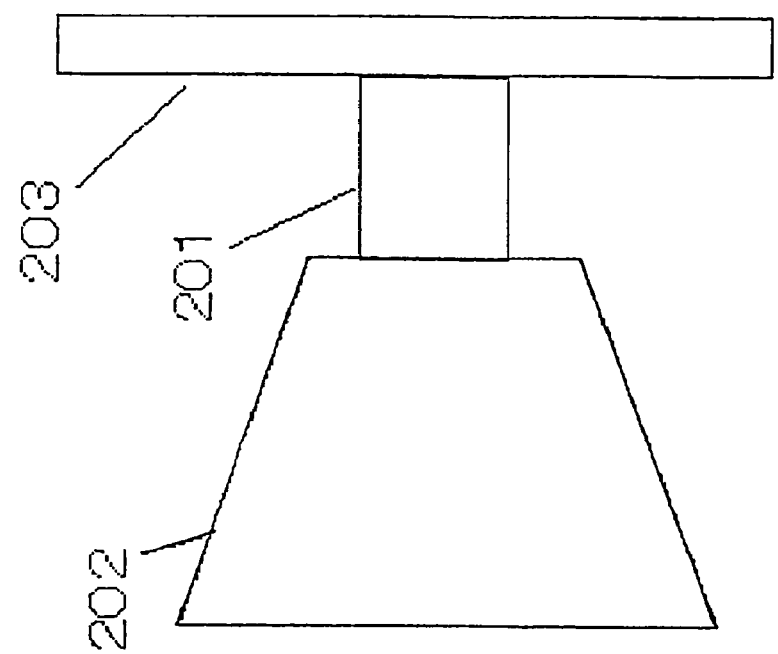
FIG. 12A is a plane view showing a first modification example of air blow plate of the piezoelectric fan shown in FIG. 11.
Figure 12B:
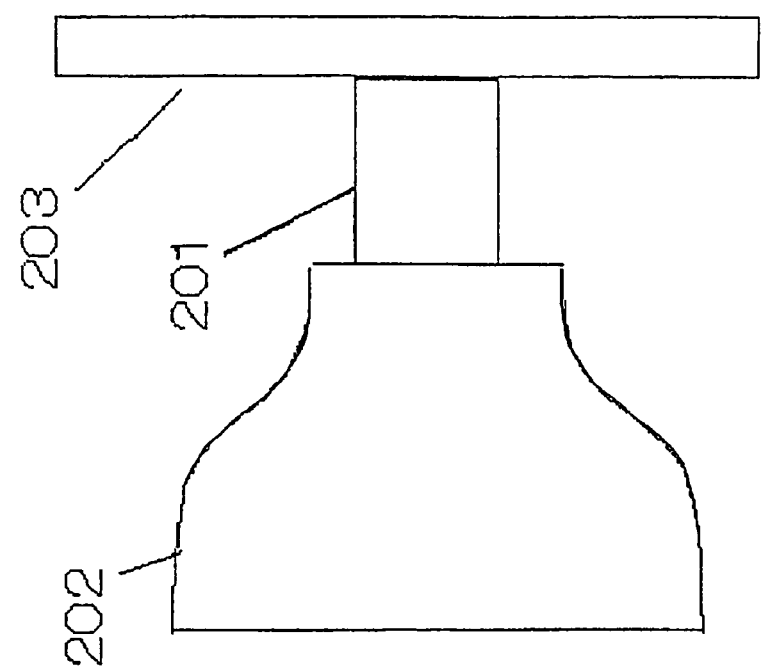
FIG. 12B is a plane view showing a second modification example of air blow plate of the piezoelectric fan shown in FIG. 11.
Figure 13A:
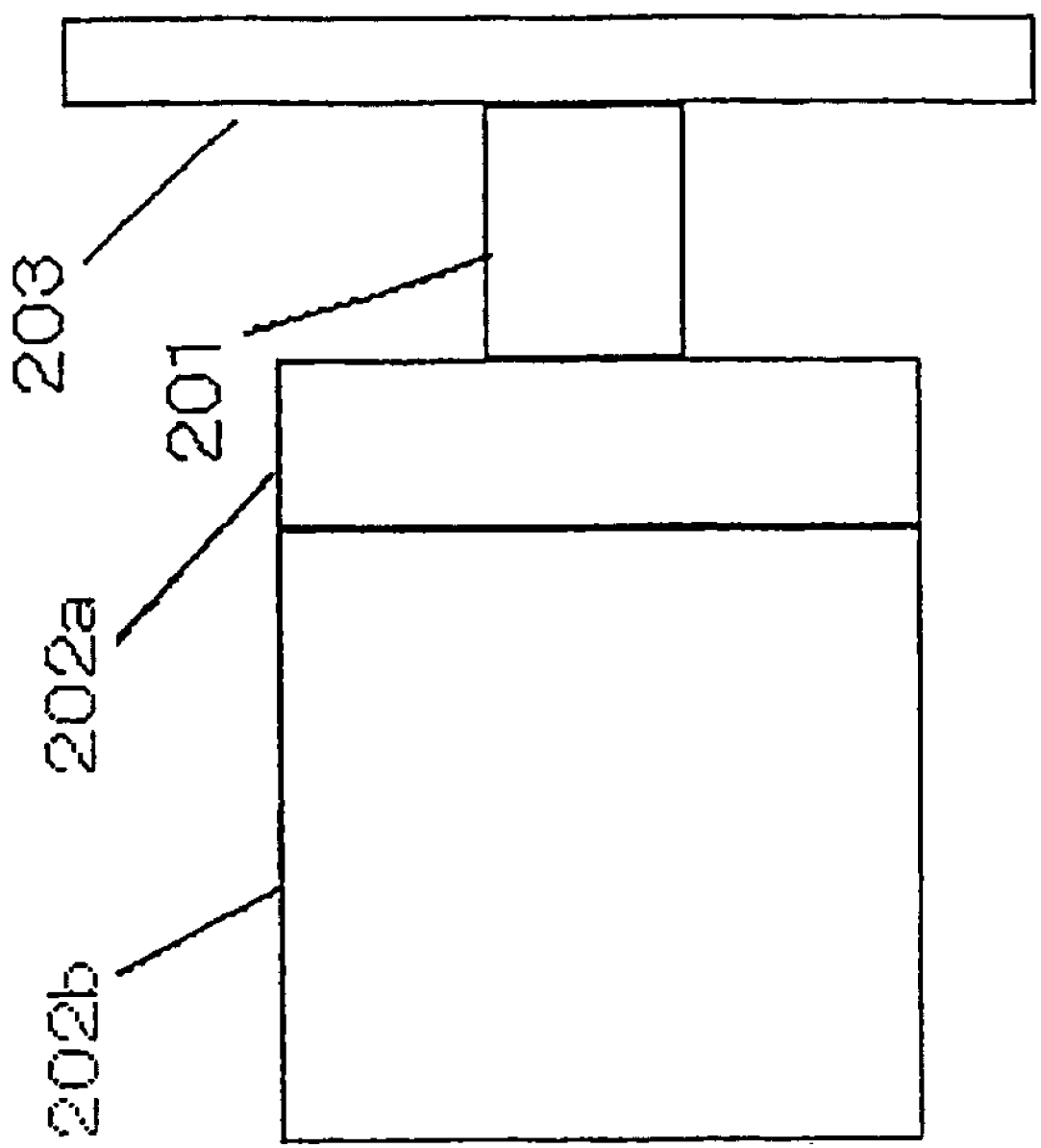
FIG. 13A is a plane view showing a third modification example of air blow plate of the piezoelectric fan shown in FIG. 11.
Figure 13B:
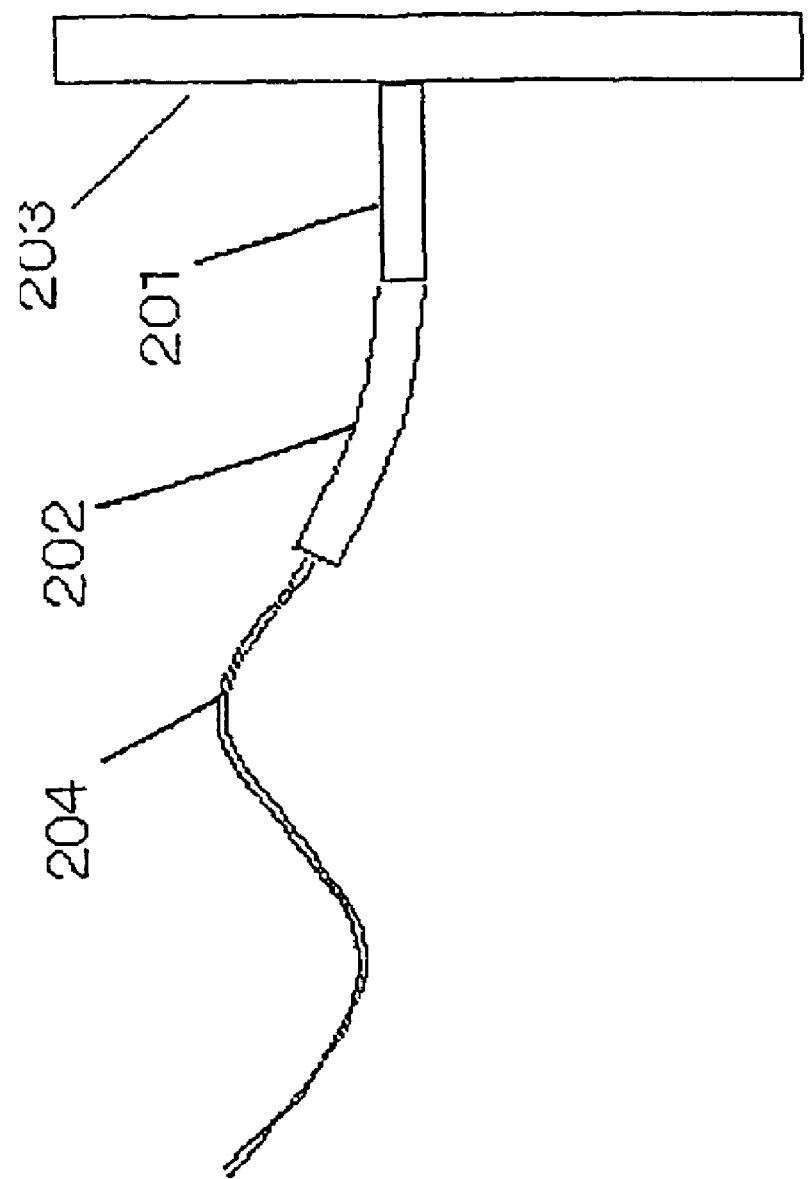
FIG. 13B is a side view showing a fourth modification example of air blow plate of the piezoelectric fan shown in FIG. 11.
Figure 14:
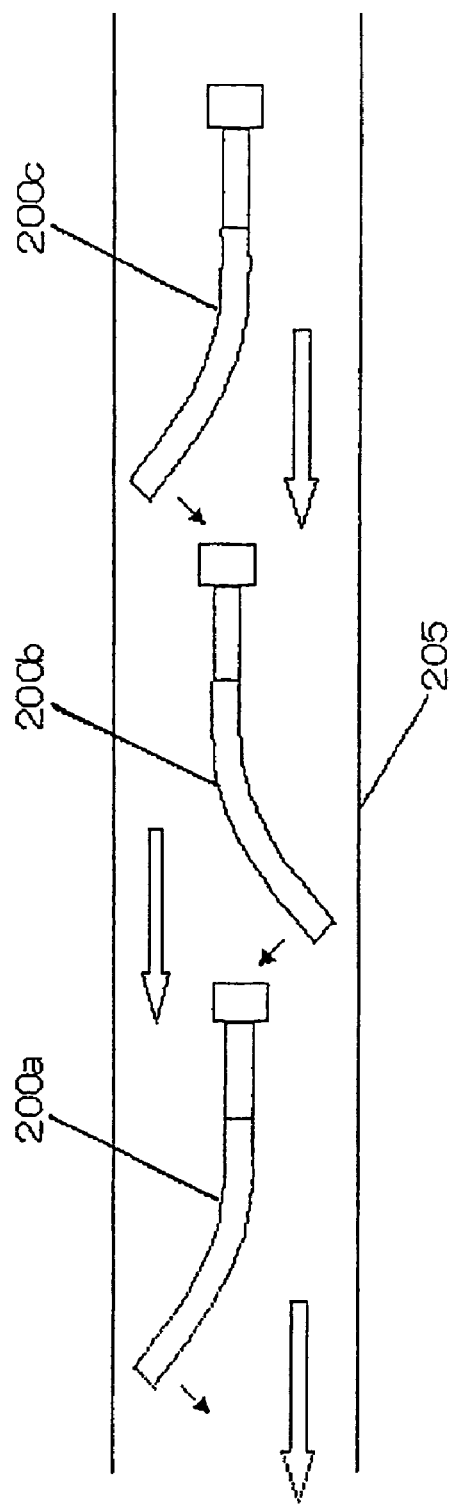
FIG. 14 is a side view showing an example using a plurality of piezoelectric fans as an air cooling fan of a cooling apparatus for electronic devices of the present invention.
Figure 15A:
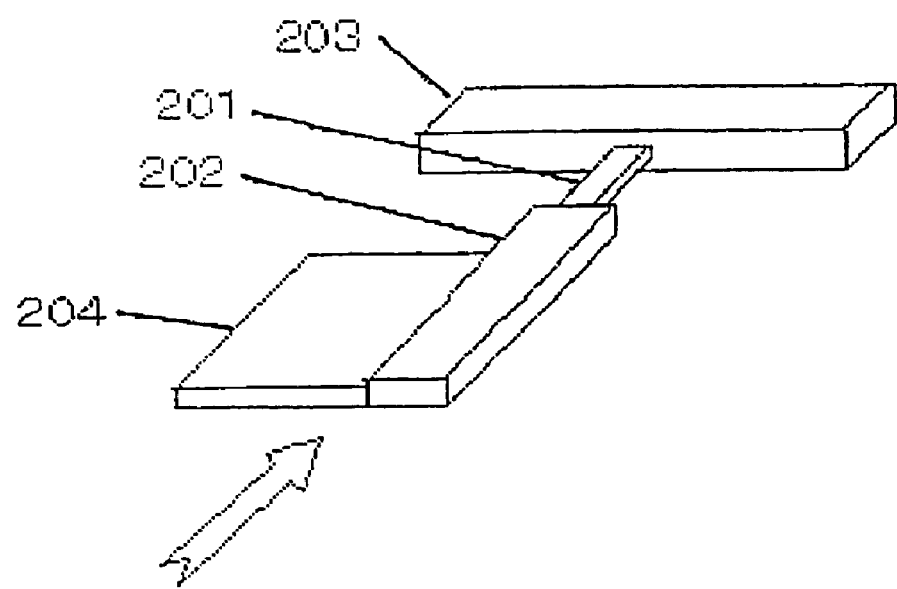
FIG. 15A is a perspective view showing a configuration of modification example of piezoelectric fan for using as an air cooling fan of a cooling apparatus for electronic devices of the present invention.
Figure 15B:
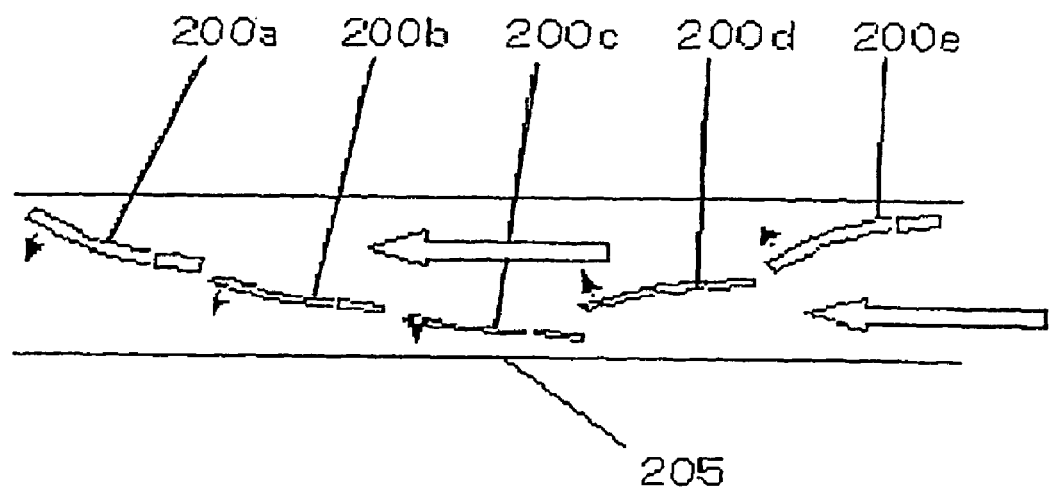
FIG. 15B is a side view showing an example using a plurality of piezoelectric fans shown in FIG. 15A.

FIG. 11 is a perspective view showing a configuration of the piezoelectric fan for using as an air cooling fan of the cooling apparatus for electronic devices of the present invention. FIG. 12A is a top plane view showing a first modification of an air blowing plate of the piezoelectric fan shown in FIG. 11. FIG. 12B is a top plane view showing a second modification of the air blowing plate of the piezoelectric fan shown in FIG. 11. FIG. 13A is a plane view showing a third modification of the air blowing plate of the piezoelectric fan shown in FIG. 11. FIG. 13B is a plane view showing a fourth modification of the air blowing plate of the piezoelectric fan shown in FIG. 11. FIG. 14 is a side view showing an example using a plurality of piezoelectric fans as an air cooling fan of the cooling apparatus for electronic devices of the present invention. FIG. 15A is a perspective view showing a configuration of a modification example of the piezoelectric fan for using as an air cooling fan of the cooling apparatus for electronic devices of the present invention. FIG. 15B is a side view showing an example using a plurality of piezoelectric fans shown in FIG. 15A.

A piezoelectric fan 200 may be used for an air cooling fan 16 of the cooling apparatus 1 for electronic devices of this embodiment shown in FIG. 2A and FIG. 2B. Referring to FIG. 11, it can be seen that the piezoelectric fan 200 is configured such that an air blowing plate 202 is joined to one end of a piezoelectric element 201, and the other end of the piezoelectric element 201 is fixed to a support 203. The air blowing plate 202 vibrates up and down by operating the piezoelectric element 201, resulting in air blowing.

FIG. 12A is the first modification example of the air blowing plate 202 having a trapezoidal plate, which width becomes wider linearly with reaching to the end. FIG. 12B is the second modification example of the air blowing plate 202 having a trapezoidal plate, which width becomes larger non-linearly with reaching to the end. When the first or the second modification example of the air blowing plate 202 is employed to the piezoelectric fan 200, an inclusion of air from a side area becomes easy, thereby much air can be fed. Accordingly, a blowing volume of the piezoelectric fan 200 can be increased in both cases.

The piezoelectric fan 200 may have a structure combining a plurality of materials and thicknesses. In the third modification example shown in FIG. 13A, the air blowing plate 202 is consist of an air blowing plate 202a and an air blowing plate 202b which have different elastic force, respectively. The elastic constant of the air blowing plate 202b for air blowing, which has an open end, is smaller than that of the air blowing plate 202a joined to the piezoelectric element 201. In the fourth modification example shown in FIG. 13B, a thin air blowing plate 204, which has a thinner air blowing plate than that of the air blowing plate 202, is joined to the air blowing plate 202. In the fourth modification example, the thin air blowing plate 204 bends easier than the air blowing plate 202 since the thin air blowing plate 204 is thinner than the air blowing plate 202. When the third or the fourth modification example of the air blowing plate 202 is employed to the piezoelectric fan 200, an air blowing volume of the piezoelectric fan 200 can be increased in both cases.

It is possible to stabilize an air flow rate using a plurality of piezoelectric fan 200 for the air cooling fan 16. For example, according to a structure of the air cooling fan shown in FIG. 14, the plurality of piezoelectric fan 200a~200e are arranged with a constant interval along direction of air flow having wall 205 at both side of the air flow. In addition, by shifting a driving phase of the piezoelectric fans by ½ to each other, the air flow rate more stable than that of a single piezoelectric fan can be achieved.

According to a piezoelectric fan shown in FIG. 15, the air blowing plate 202 is joined to the piezoelectric element 201. In addition, the thin blowing plate 204 is attached to the side of the blowing plate 202. FIG. 15B is a schematic view showing that a plurality of piezoelectric fans having the structure of the air cooling fan 204 shown in FIG. 5A is arranged along the air flow. In this example, five piezoelectric fans 200a~200e are arranged, and operated by shifting each phase of the piezoelectric fans by ¼. With this structure and arrangement, the air flow rate can be stabilized.

Next, a configuration of a piezoelectric pump which is applicable to a liquid cooling pump 14 shown in FIGS. 2A and 2B will be explained in detail by referring FIGS. 16, 17, 18A, 18B, and 18C.

Figure 16:
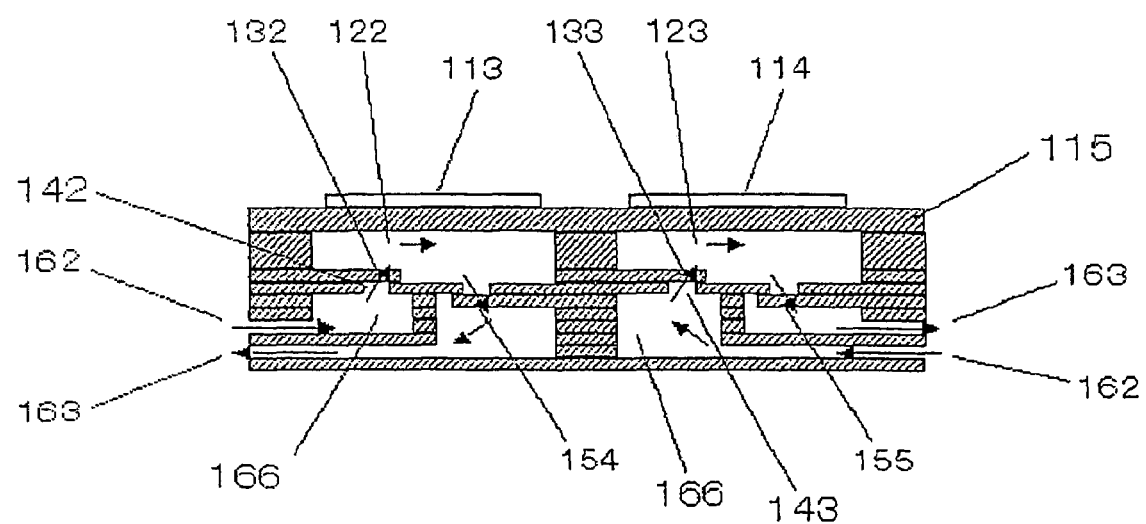
FIG. 16 is a cross sectional view showing a stacked piezoelectric pump for using as a liquid cooling pump of a cooling apparatus for electronic devices of the present invention.
Figure 17:
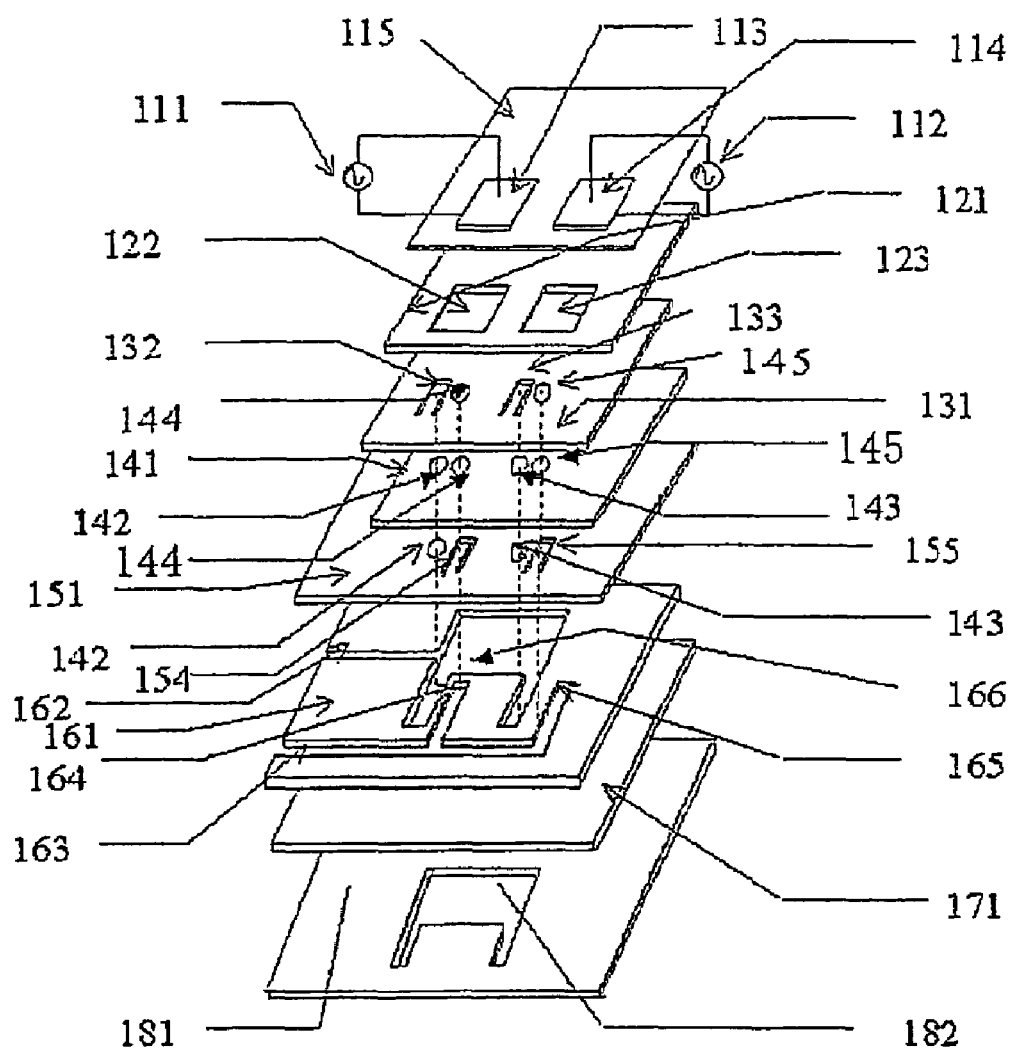
FIG. 17 is a configuration view showing a configuration of a stacked piezoelectric pump shown in FIG. 16.
Figure 18A:
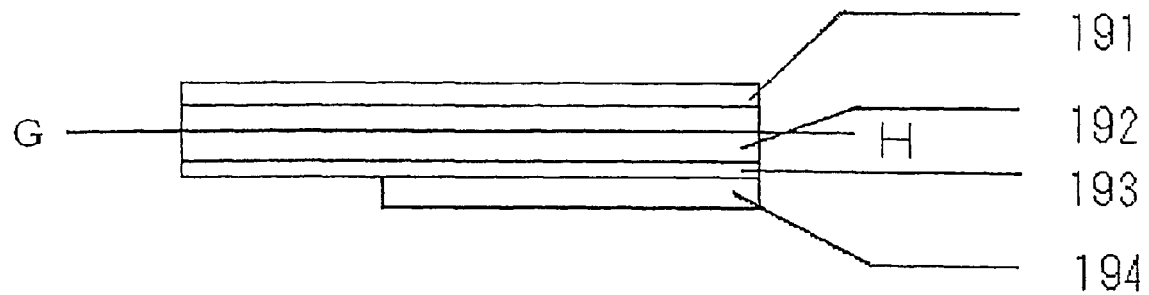
FIG. 18A is a cross sectional view showing a stacked structure of a toric piezoelectric pump for using as a liquid cooling pump of a cooling apparatus for electronic devices of the present invention.
Figure 18B:
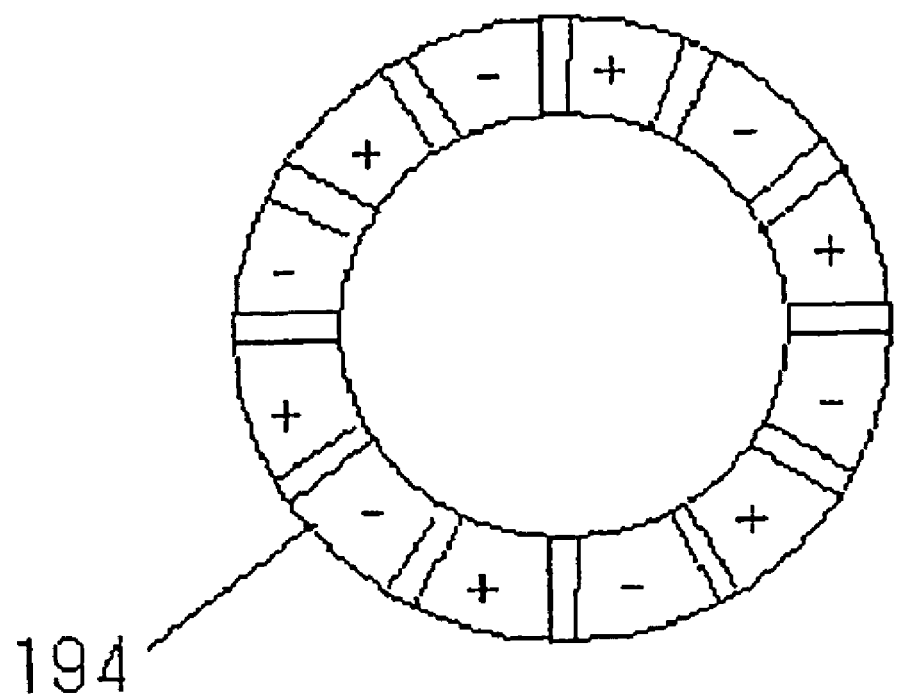
FIG. 18B is a G-H cross section view of a stacked structure shown in FIG. 18A.
Figure 18C:
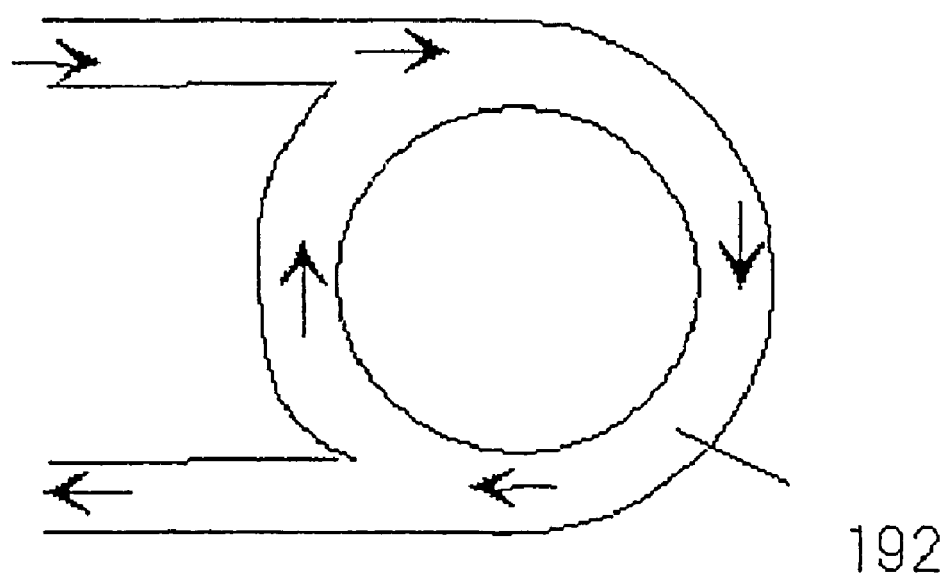
FIG. 18C is a bottom view of a stacked structure shown in FIG. 18A.

FIG. 16 is a cross sectional view showing a configuration of a stacked piezoelectric pump for using as a liquid cooling pump of the cooling apparatus for electronic devices of the present invention. FIG. 17 is a configuration view showing a configuration of the stacked piezoelectric pump shown in FIG. 16. FIG. 18A is a cross sectional view showing a stacked structure of a toric piezoelectric pump for using as a liquid cooling pump of the cooling apparatus for electronic devices of the present invention. FIG. 18B is a cross sectional view of the stacked structure cut at G-H line shown in FIG. 18A. FIG. 18C is a bottom view of the stacked structure shown in FIG. 18A.

For achieving a cooling apparatus which has a low noise, thin body, and high performance, and also stimulates circulation of a hot liquid, a role of pump stimulating circulation of the coolant is very important. In addition, regarding a small size electronic device which requires portability, the portability is essential, thereby a battery is used as well as commercial power sources such as an AC-DC adaptor and the like as the electric energy supply source. Since a storage capacity of electric energy of the battery is limited, power consumption of the cooling apparatus must be minimized. Heat generation by a pump driving source causes an increase in temperature of the coolant, thereby resulting in decrease of heat exchange performance. Therefore, it is necessary to use the pump driving source which has a high converting efficiency from electric energy to mechanical energy. A piezoelectric actuator using a piezoelectric ceramics is known as a device having a high converting efficiency from electric energy to mechanical energy in general A polarized piezoelectric ceramics is able to generate a bending vibration by operating it attaching on, for example, a metal plate. Characteristics of the piezoelectric actuator having the stacked plate structure are such that the displacement is not so large, it can be thin, the power generation is large, and high frequency operation is easy.

However, for the piezoelectric pump which is making use of the bending motion of the piezoelectric actuator, a check valve is required for guiding a flow in one direction. Then, a delay of flow speed caused by the mass thereof and a generation of pressure loss must be prevented. If a connection part of the piezoelectric pump unit and a flow path is formed with an elastic material such as resin and the like, the pressure loss may be generated. In addition, the elastic material used at the connection part may be degraded during long use. As a result, for example, leakage and volatilization of the coolant from each part may be caused. In a coolant circulation type of cooling apparatus, in which the coolant is encapsulated, the check valve intermittently operates. Then, it is difficult to obtain a constant flow rate. In addition, in the closed circulation cooling apparatus, a countermeasure is necessary for the pressure loss caused by foams generating in the coolant in the flow path. An amount of heat of a heat generation source changes with time. According to the change of the amount of heat, physical properties, for example, viscosity and thermal expansion of materials composing the cooling apparatus change by the temperature change of the coolant circulating in the cooling apparatus, thereby a change of flow rate is likely to happen by the pressure fluctuation. If the check valve is arranged under the pump, the thinning of the pump becomes difficult due to the check valve. Accordingly, if a piezoelectric pump is employed to the cooling apparatus 1 for electronic devices of the present invention, issues described in the above must be solved.

As a stacked piezoelectric pump applied to the present invention, as shown in FIG. 16, an unified bending-type piezoelectric pump which has a stacked plate structure having two pressure rooms may be used. The unified bending-type piezoelectric pump introduces liquid through an inlet 162 and exhaust the liquid through an outlet 163 by introducing the liquid to the pressure rooms 122, 123 and exhausting the liquid from the pressure rooms 122, 123 with respective stretching motion of pressure plates 113, 114. In the pressure rooms 122, 123, introduction check valves 132, 133 for limiting flow direction of the liquid and exhaust check valves 154, 155 are disposed respectively. In FIG. 16, the inlet 162 and the outlet 163 are arranged on both right side and left side, respectively. However, the inlet 162 and the outlet 163 are connected at a position distant from the pump. Arrows in FIG. 16 show flowing directions of the liquid. In addition, the unified bending-type piezoelectric pump is incorporated in the liquid cooling unit 9 in a similar manner to a liquid driving pump 50 shown in FIG. 6. Since the unified bending-type piezoelectric pump and the liquid cooling unit 9 are integrated in a unit with metal materials, for example, Al, Stainless Steel, and Cu, the pressure loss is prevented.

A flowing speed of the liquid flown in through the inlet 162 is decelerated at a spare room 166 and reaches to the introduction check valves 132, 133 through introduction holes 142, 143. At the time, the introduction check valves 132, 133 are lifted up to the direction of pressure rooms 122, 123, and the liquid reaches to the pressure rooms 122, 123. In the pressure rooms 122, 123, a bending vibration of a vibration plate 115 is generated by stretching motion of piezoelectric plates 113, 114. Then, the liquid is pressed, but does not flow back since the introduction holes 142, 143 are shut by coming down of the introduction check valves 132, 133. At the same time, since exhaust check valves 154, 155 come down, the liquid is exhausted through the outlet 163 via exhaust holes 144, 145. The introduction check valves 132, 133 and the exhaust check valves 154, 155 are made thin, for example, by using a plate vane structure, thereby they can rapidly operate without preventing the liquid motion.

A practical fabrication method of the unified bending-type piezoelectric pump will be explained in detail by referring to FIG. 17.

Piezoelectric plates 113, 114 are made of lead zirconate titanate-based ceramics material. The piezoelectric ceramics material is formed of 15 mm in length, 15 mm in width, and 0.1 mm in thickness, and silver electrodes are formed on both main surfaces with a calcined method. Meanwhile, for example, gold, nickel, chromium, Cu, silver, palladium alloy, and platinum, which are electrically conductive, may be used for the electrode. In addition, for example, a sputtering, a plating, an evaporation, and a chemical vapor deposition may be employed for the electrode forming method. The piezoelectric plates 113, 114, which are formed electrodes thereon having no effect on the performance, are bonded to a vibration plate 115 with an acryl-based bonder or a polyimide-based bonder. In this embodiment, the piezoelectric plates 113, 114 have been prepared with machine work. However, if xirconia ceramics or silicon is used for the vibration plate 115, it is possible to integrate the piezoelectric ceramics in a unit using a print-calcined method, or a sputtering method, or a sol-gel method, or a chemical vapor deposition method.

As shown in FIG. 17, the vibration plate 115 made of Al formed of 50 mm in length, 50 mm in width, and 0.05 mm in thickness, a pressure room plate 121 made of Al formed of 50 mm in length, 50 mm in width, and 0.2 mm in thickness, an upper check valve plate 131 made of Al formed of 50 mm in length, 50 mm in width, and 0.5 mm in thickness, a center check valve plate 141 made of Al formed of 50 mm in length, 50 mm in width, and 0.2 mm in thickness, a lower check valve plate 151 made of Al formed of 50 mm in length, 50 mm in width, and 0.1 mm in thickness, an introduction-exhaust plate 161 made of Al formed of 50 mm in length, 50 mm in width, and 0.4 mm in thickness, an elastic plate 171 made of Al formed of 50 mm in length, 50 mm in width, and 0.1 mm in thickness, and a rigid plate 181 made of Al formed of 50 mm in length, 50 mm in width, and 1 mm in thickness, are stacked in a unit using a diffusion bonding technique. The total thickness is 2.55 mm, resulting in realization of a thin pump.

The piezoelectric plates 113, 114 are bonded to positions on the vibration plate 115 corresponding to the pressure rooms 122, 123. Power sources 111, 112 are connected to the piezoelectric plates 113, 114. In addition, the pressure rooms 122, 123 having a size of 15 mm in width and 15 mm in length are formed on the pressure room plate 121, the introduction check valves 132, 133 and the exhaust holes 144, 145 are formed on the upper check valve plate 131, the introduction holes 142, 143 and the exhaust holes 144, 145 are formed on the center check valve plate 141, the exhaust check valves 154, 155 and the introduction holes 142, 143 are formed on the lower check valve plate 151, the inlet 162 and an introduction flow path 164, and the outlet 163 and an exhaust flow path 164, and the spare room 166, are formed on the introduction-exhaust plate 161, and an elastic plate disintermediate 182 is formed on the rigid plate 181. The introduction holes 142, 143 and the exhaust holes 144, 145 are 5 mm in diameter, the introduction check valves 132, 133 and the exhaust check valves 154, 155 have a size of 10 mm in length and 6 mm in width and their ends are arranged at positions sealing each introduction hole and exhaust hole, respectively. The piezoelectric plates 113, 114 are able to operate at low voltage if the structure is formed by stacking the piezoelectric ceramics and the electrode one after the other. Furthermore, if a bimorph structure is employed by sandwiching the vibration plate 115 with the piezoelectric plates 113, 114 at both upper and lower sides, the introduction and exhaust pressure of the liquid can be increased.

As shown in FIG. 17, two or more pressure rooms 122, 123 are formed as a plurality of pump units. Using at least two pumps, when one pump unit exhausts liquid, another pump unit introduces liquid, and the pump unit introduced the liquid exhausts liquid this time, and another pump unit exhausted the liquid introduces liquid. By operating two pump units combining in the above manner, the liquid flow rate can constantly be maintained.

As an example, the piezoelectric pump has been operated by applying DC 50 V, AC amplitude 50 V, 10 kHz and half cycle electric field to the piezoelectric plates 113, 114 for the liquid introduction operation, and also by applying DC 50 V, AC amplitude 50 V having a reverse phase of the liquid introduction operation, and 5 kHz for the liquid exhaust operation. The flow rate can be stabilized by controlling two pumps to operate in opposite phase to each other, that is, to operate alternately to each other. In addition, through control of the power sources 111, 112, an introduction time of the liquid is made longer more than two times of that of the exhaust time. Due to the above, efficiency of the exhaust is improved since a turbulent flow in the pump room caused by the exhaust is stabilized. If the lower check valve plate 151, the introduction-exhaust plate 161, the elastic plate 171, and the rigid plate 181 are made of metal material and also are unified with a coolant circulation unit, the connection part shown in the conventional art is not necessary, and thereby the pressure loss due to the connection part can be avoided. In addition, since resin is not used for the connection part, the liquid is prevented from leaking and evaporating due to a crack of the resin caused by long use.

For the liquid cooling pump 14, as shown in FIGS. 18A, 18B, and 18C, a piezoelectric pump disposed a toric piezoelectric actuator may be used. The piezoelectric pump disposed the toric piezoelectric actuator generates a traveling wave by sequentially bending each piezoelectric plate by changing a phase for driving the piezoelectric plate which forms the toric piezoelectric actuator. With the above method, the liquid in the flow path is circulated in one direction without using the check valve.

As shown in FIG. 18A, a flow path 192 is sealed with two protection plates of an upper protection plate 191 and a lower protection plate 193. As shown in FIG. 18B, a toric piezoelectric actuator 194 is arranged at a bottom surface of the lower protection plate 193, and joined each other along the toric part of the flow path 192 shown in FIG. 18C. For example, by arranging each part of the piezoelectric actuator 194 with an opposite polarity one after the other, and also by applying an electric field to the each part by shifting the phase, the piezoelectric actuator 194 generates up and down stretching motion similar to a traveling wave, thereby the liquid staying in the flow path 192 generates a circular movement along the toric flow path, thereby the introduction and the exhaust of the liquid simultaneously take place for the flow paths shown at left side in FIG. 18C, and thereby resulting in one direction of the liquid flow. A pump, which neglects the check valve by using the motion of the piezoelectric actuator 194 and circulates liquid including foams generating in the flow path 192, can be realized.

A configuration of an evaporation-method pump, which uses boiling and evaporation of liquid and is applicable to the liquid cooling pump, will be explained in detail referring to FIG. 19 and FIG. 20.

Figure 19:
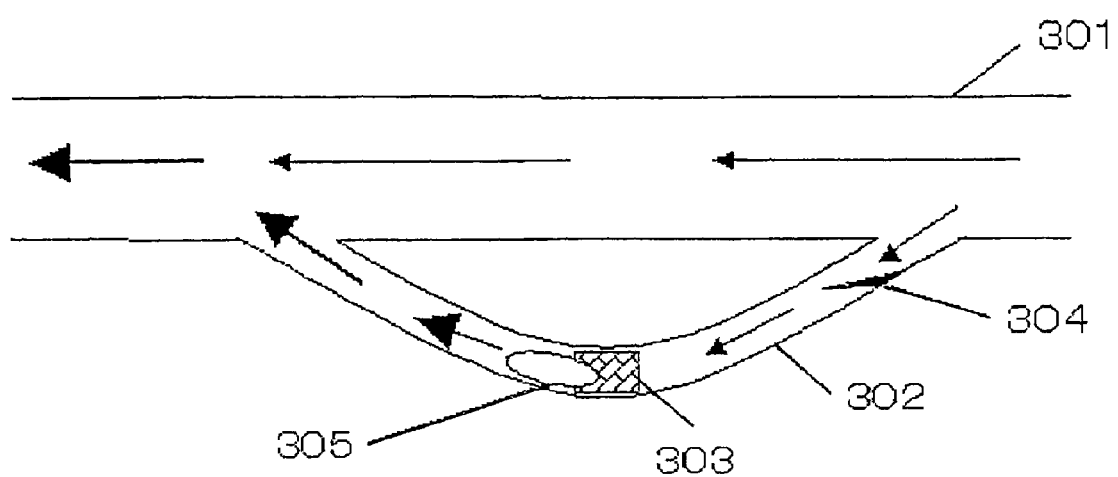
FIG. 19 is a partial plane view showing an evaporation-method pump for using as a liquid cooling pump of a cooling apparatus for electronic devices of the present invention.
Figure 20A:
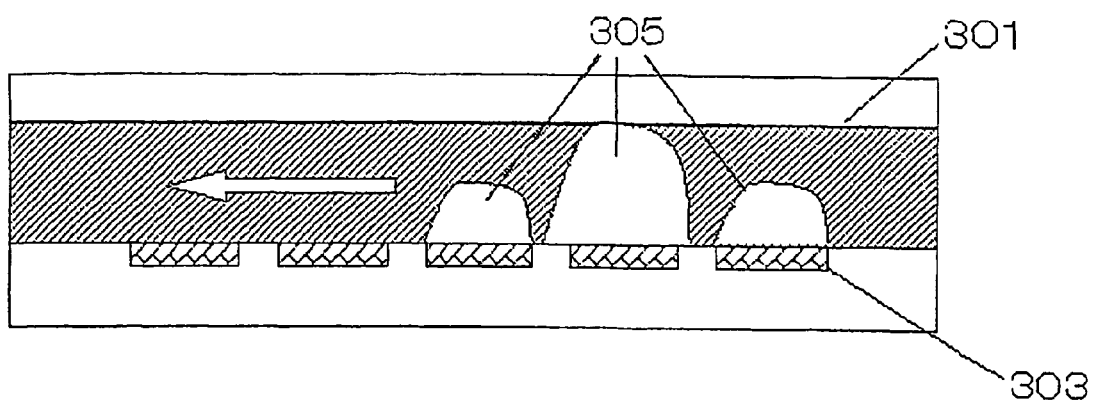
FIG. 20A is a traverse cross sectional view showing an evaporation status of evaporation-method pump at a time for using as a liquid cooling pump of a cooling apparatus for electronic devices of the present invention.
Figure 20B:
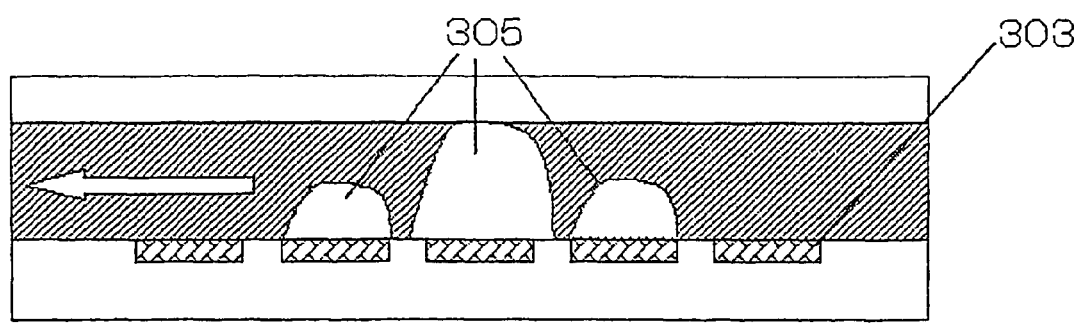
FIG. 20B is a traverse cross sectional view showing an evaporation status of evaporation-method pump for using as a liquid cooling pump of a cooling apparatus for electronic devices of the present invention at the time 100 milli-second later from a state shown in FIG. 20A.

FIG. 19 is a partial plane view showing a configuration of the evaporation-method pump for the liquid cooling pump of the cooling apparatus for electric devices of the present invention. FIG. 20A is a traverse cross sectional view showing an aspect of evaporation of the evaporation-method pump at a time for the liquid cooling pump of the cooling apparatus for electric devices of the present invention. FIG. 20B is a traverse cross sectional view showing the aspect of evaporation of the evaporation-method pump, which is used for the liquid cooling pump of the cooling apparatus for electric devices of the present invention, at the time 100 milli-second later from the state of FIG. 20A According to FIG. 19, in which an evaporation-method pump for the liquid cooling pump 14 is shown, a subsidiary stream 302 branched from a main stream 301 of the liquid is formed, and a heat generator 303 is arranged in the subsidiary stream 302. If a temperature of the liquid contacting to the heat generator exceeds the boiling temperature by temperature rise of the heat generator with power supply to the heat generator 303, the liquid boils, thereby a steam 305 is generated. As a result, a liquid flow is generated. In front of the heat generator 303 in the subsidiary stream 302, a check valve 304 is arranged for preventing from flowing back of the liquid. Accordingly, the liquid is controlled to flow in one direction. Generally, if a liquid is vaporized by boiling, a volume of the vapor becomes substantially larger than that of the liquid. Then, if a liquid in a closed flow path is partially boiled with heating, the liquid is pushed out due to the expansion of the vaporization. Implementing this process continuously and by arranging a check valve structure at a part of the flow path, a pumping function for liquid can be realized.

In FIGS. 20A and 20B, a configuration of evaporation-method pump disposing a plurality of heat generators 303 is shown. Five heat generators 303 are arranged side by side close to the liquid in main stream 301. FIG. 20A shows an aspect of the evaporation at a time, and steams are being generated from the top of each heat generator. FIG. 20B shows an aspect of evaporation at the time 100 milli-second later from the state of FIG. 20A. If the timing of evaporation of the heat generator is coordinated so that the liquid flows in the desired direction, a liquid flow can be formed. That is, the steams 305 evaporating in the aspect shown in FIG. 20B is sifted to the left side compared with the steams 305 shown in FIG. 20A. Continuing this process, the liquid can be flown from the right to the left as indicated with arrows in FIGS. 20A and 20B.

In the embodiments described in the above, for example, a DC fan 21 and a piezoelectric fan 200 are employed as an air cooling fan, and also an electromagnetic pump, a piezoelectric pump, and an evaporation-method pump are employed as a liquid cooling pump. However, a combination of them is optional.

A cooling apparatus 1 of the present invention can be demonstrated its effectiveness by mounting it on any kind of electronic devices. For example, since a note PC and the like have substantially large power consumption and the body is small and thin, the effect of the cooling apparatus of the present invention is substantially large. For example, if the cooling apparatus of the present invention with a size of 5 mm in thickness and about 100 mm×200 mm in length and width is employed, a CPU with power consumption about 40 W can be cooled. Therefore, a note PC mounting the cooling apparatus of the present invention can be made small, thin, and low noise, thereby resulting in realization of an attractive note PC for consumers. The cooling apparatus 1 is also able to mount on other electronic devices, for example, a desktop computer, a computer server, network devices, a plasma display, a projector, and a home server, resulting in realization of small, low noise and high cooling performance devices, as in the case of note PC.

For demonstrating cooling performance of the cooling apparatus of the present invention, by encapsulating at least 20 ml of cooling water in the flow path 10 of the liquid cooling unit 9, which has a contour size of 200 mm×100 mm, and 1 mm in thickness, and by circulating the cooling water with flow rate of 10~20 ml/minutes, the maximum temperature of CPU having power consumption of about 25 W has been demonstrated to be suppressed at 90 C or less without air cooling unit 12 by experiment. Accordingly, the volume of the liquid cooling unit and the unit itself can be made about ⅕ and thinner respectively, compared with the conventional heat-pipe technique and the enforced air cooling technique, which can cool the CPU with power consumption of about 25 W.

In addition, in a configuration which combines the liquid cooling unit 9 and the air cooling unit 12 of the present invention having a contour size of 200 mm×100 mm, and 5 mm in thickness, by encapsulating at least 20 ml of cooling water in the flow path 10 of the liquid cooling unit 9 and circulating the cooling water with flow rate of 10~20 ml/minute, and also by generating a forced air convection of about 0.8 m/second with air fans arranged in the air cooling unit 12 which has the fin group, the air channel 1 and the air channel 2, the maximum temperature of CPU having power consumption of about 40 W has been demonstrated to be suppressed at 90 C or less by experiment. Accordingly, the volume of the liquid cooling unit can be made about 1/10, and the unit can also be made thin, compared with the conventional enforced air cooling technique, which can cool a CPU with power consumption of about 40 W.

Regarding noise of the present liquid cooling apparatus, by employing the piezoelectric technique described in the above embodiment as a driving source for both the internal air cooling fan 30 which is arranged in the air cooling unit 12 of the cooling apparatus 1 and the liquid driving pump 50 which is arranged in the liquid cooling unit 9, the noise level in operation of the present liquid cooling apparatus has been suppressed at 30 dB or less. In the conventional enforced air cooling technique which cools the CPU with power consumption of around 40 W, at least two DC fans 21 are used, for example, in case of note PC. Its noise level reaches to at around 40 dB. As seen from the above, the noise level in this embodiment has been substantially improved. Accordingly, a note PC which mounts the present cooling apparatus can be used at a public space where noise generation is forbidden, for example, a library, a hospital and the like.

Regarding a fabricating method of the liquid cooling unit 9 and the air cooling unit 12 of the cooling apparatus 1, metal materials, for example, Cu, Al, and Stainless Steel are used, and fabrication techniques, for example, a common die-cast technique, a die technique, and a etching technique, which are similar techniques for fabricating the conventional heat-sink are applicable for fabricating the liquid cooling unit 9 and the air cooling unit 12 in a unit.

As explained in the above, according to the present embodiment, the liquid cooling unit 9 and the air cooling unit 12 are being stacked, a platy shape or a shape close to a platy shape is available for each component, the each component can be built in a unit with stacking, and thereby the whole shape can be made flat. Furthermore, it is superior in thermal conduction and in heat dissipation, available to make the total configuration thin, and easy to build and to fix to electronic devices.

In addition, according to the present embodiment, by integrating the liquid driving pump 50 with the liquid cooling unit 9, freedom of design is improved, thereby the total thickness can be made thin, 10 mm or less, or 5 mm or less, and thereby freedom for mounting it on electronic devices, especially on such as note PC and the like can be improved.

According to the present embodiment, in the air cooling unit 12, by disposing a common air flow path for flowing air which passed through an individual air flow path, as well as disposing an air vent for introducing air which is not warmed by forming a plurality of individual air flow paths, the heat absorbed from heat generation components within a limited space can be effectively exhausted outside of electronic devices.

According to the present embodiment, in the liquid cooling unit 9 having a flow path 10 in which a coolant flows, by forming an air cooling fin group flow path 70 within the air cooling fin, and by forming a micro channel 61 for partially improving a flow speed within a part of the flow path 10, an efficiency of heat exchange with the cooling media is improved, thereby resulting in increase in the cooling performance.

According to the present embodiment, by combining a liquid circulation cooling unit which uses the liquid cooling pump 14 and an enforced air cooling using the air cooling fan 16, a blowing volume of the air cooling fan 16 is suppressed. Therefore, noise generation by the air cooling fan 16 can be reduced.

An electromagnetic pump, a piezoelectric bimorph pump, a bubble pump, and a pump combined with the air cooling pump are applicable to the liquid cooling pump 14 or the liquid driving pump 50 of the present embodiment. Using these pumps, a liquid circulation volume per unit time is increased, and also the thickness and the volume of whole cooling apparatus can be reduced.

Regarding a power supply from outside to an electric control circuit for driving the liquid cooling pump 14 or the liquid driving pump 50 and the air cooling fan 16 of the present embodiment, DC current is preferable. By incorporating information on temperatures of, for example, the CPU 6 and the heat generator 7 into the electric control circuit, the liquid cooling pump 14 or the liquid driving pump 50 and the air cooling fan 16 are driven so that the temperature of the heat generation component is maintained at the maximum temperature within the upper limit. As a result, the power consumption of the cooling apparatus 1 can be saved.

As a control circuit for the cooling apparatus 1, an electric driving circuit for driving the liquid cooling pump 14 or the liquid driving pump 50 and an electric driving circuit for driving the air cooling fan 16 exist. A configuration in which an input voltage of the electric driving circuit is set under a predetermined voltage, or both voltages of the electric driving circuits are unified, is effective to achieve simplification of the control circuit, improvement of the efficiency, and increase in accuracy in this case, thereby resulting in high performance of the cooling apparatus in total.

It is obvious that the present invention may be embodied in other specific forms without departing from the spirit or essential characteristics thereof. In addition, the number, the position, and the shape of the component consisting of the cooling apparatus are not limited to the above embodiments, and they may be made in an appropriate number, position, and shape suitable for embodying the present invention. An element showing the same element in each figure has the same sign.

The present invention has been explained by referring several preferred configurations and embodiments. The configurations and embodiments are to be considered in all respect as illustrative and not restrictive. It is apparent to be easy to employ a variety of modifications and changes for component and technique equivalent to the present invention for a skilled people after reading the specification. The scope of the present invention being indicated by the appended claims rather than by the foregoing description and all changes which come within the meaning and range of equivalency of the claims are therefore intended to be embraced therein.

POSSIBILITY FOR INDUSTRIAL APPLICATION

The cooling apparatus for electronic devices of the present invention has a configuration stacking the liquid cooling unit and the air cooling unit. The each component can adopt a platy shape or a shape similar to platy shape. The each component can be built into a unit by stacking. Since the whole shape of the apparatus can be made as a platy shape, the apparatus is superior in thermal conduction and in heat dissipation, and is easy to make thin the total configuration and also easy to build and fix the apparatus in the electronic devices.

In addition, according to the embodiment, the cooling apparatus can take a configuration to integrate the liquid driving pump with the liquid cooling unit. As a result, design freedom of the cooling apparatus is improved, the total thickness can be thinned to 10 mm or less, or 5 mm or less. Accordingly, freedom for mounting the cooling apparatus on electronic devices, especially on note PC can be improved.

Furthermore, according to the present embodiment, in the air cooling unit, by forming a common air flow path for flowing air which passed through an individual air flow path, as well as forming an air vent for introducing air which is not warmed by disposing a plurality of individual air flow paths, the heat absorbed from heat generation components within a limited space can be effectively exhausted outside of electronic devices.

According to the present embodiment, in the liquid cooling unit having a flow path in which a coolant flows, by forming an air cooling fin group flow path within the air cooling fin, and by forming a micro channel for partially improving a flow speed within a part of the flow path, an efficiency of heat exchange with the cooling media is improved, thereby resulting in increase in the cooling performance.

According to the present embodiment, by combining a liquid circulation cooling unit which uses the liquid cooling pump and an enforced air cooling using the air cooling fan, a blowing volume of the air cooling fan is suppressed. As a result, noise generation by the air cooling fan 16 can be reduced.

What is claimed is:

1. A cooling apparatus for cooling a heat generator in electronic devices comprising:
    an unit for liquid cooling having a flow path in which a coolant flows and a liquid cooling pump for circulating the coolant, both of which are embedded in a base; and
    an air cooling unit member disposed on the base,
    wherein the air cooling unit comprises an air cooling fan for flowing air to the air cooling fin group,
    wherein the air cooling unit comprises a first air channel totally covering the air cooling fin group, and an air flow generated by the air cooling fan is controlled by the first air channel.

2. A cooling apparatus for cooling a heat generator in electronic devices comprising:
    a unit for liquid cooling having a flow path in which a coolant flows and a liquid cooling pump for circulating the coolant, both of which are embedded in a base; and
    an air cooling unit member disposed on the base,
    wherein at least one air hole for supplying air to the air cooling unit is formed in the liquid cooling unit.

3. A cooling apparatus for cooling a heat generator in electronic devices comprising:
    a unit for liquid cooling having a flow path in which a coolant flows and a liquid cooling pump for circulating the coolant, both of which are embedded in a base; and
    an air cooling unit member disposed on the base,
    wherein the air cooling fin group is divided into a plurality of groups, and an air hole supplying air to the air cooling fin group is formed in each plurality of groups of the air cooling fin group in the liquid cooling unit.

4. A cooling apparatus according to claim 3, wherein the air cooling unit further comprises a second air channel covering each plurality of groups of the air cooling fin group, and an air flow generated by the air cooling fan is controlled by the second air channel for not to thermally interfering among the plurality of groups of the air cooling unit.

5. A cooling apparatus according to claim 4, wherein the air cooling unit further comprises an air cooling fan in each second air channel.

6. A cooling apparatus according to claim 5, wherein the air cooling unit comprises:
    a first air channel totally covering the air cooling fin group;
    a second air channel covering each plurality of groups of the air cooling fin group respectively;
    a common air flow path formed by the first air channel; and
    a plurality of individual air flow paths formed by the plurality of second flow paths.

7. A cooling apparatus according to claim 6, wherein the air cooling unit comprises an air cooling fan arranged in the common air flow path, and an air flow is generated in each individual air flow path by the air cooling fan.

8. A cooling apparatus according to claim 7, wherein a cross section area of an aperture at a border between the individual air flow path and the common air flow path is formed to become larger according the distance from the air cooling fan so that a volume of air flow in the individual air flow path becomes equal.

9. A cooling apparatus for cooling a heat generator in electronic devices comprising:
    a unit for liquid cooling having a flow path in which a coolant flows and a liquid cooling pump for circulating the coolant, both of which are embedded in a base; and
    an air cooling unit member disposed on the base,
    wherein the air cooling unit comprises:
    a piezoelectric material supported by a support member; and
    an air blow plate, which is bonded to the piezoelectric material, generating air flow through vibration thereof by controlling voltage of the piezoelectric materials.

10. A cooling apparatus according to claim 9, wherein a shape of the air blow plate becomes wider with leaving from the piezoelectric material.

11. A cooling apparatus according to claim 9, wherein the air blow plate comprises:
    a first part having a first elastic constant located at closer side to the piezoelectric material; and
    a second part having a second elastic constant, which is higher than the first elastic constant, located at more distant side from the piezoelectric material.

12. A cooling apparatus according to claim 9, wherein the air blow plate comprises:
    a first part having a first thickness located at closer side to the piezoelectric material; and
    a second part having a second thickness, which is thicker than the first thickness, located at more distant side from the piezoelectric material.

13. A cooling apparatus according to claim 9, wherein the air cooling unit comprises an arrangement of a plurality of piezoelectric fans along an air flow, and the each piezoelectric fan adjacently arranged to each other is driven by shifting a vibration phase of the air blow plate of piezoelectric fan by ½ cycle or ¼.

14. A cooling apparatus for cooling a heat generator in electronic devices comprises:
    a flow path, in which a coolant flows, embedded in a base;
    a liquid cooling pump disposed on a surface of the base for circulating the coolant;
    a liquid cooling unit embedded in the base for connecting the flow path and the liquid cooling pump; and
    an air cooling unit member disposed on the base,
    wherein the liquid cooling pump and the liquid cooling unit are integrated in a single unit of a metal material,
    wherein the flow path is a closed loop with a circulation method, and in a part of the closed loop, a micro channel structure having a smaller cross section area than a cross section area of the flow path is formed.

15. A cooling apparatus according to claim 14, wherein the micro channel structure is formed by joining a base arranging a plurality of narrow grooves and the heat absorption surface.

16. A cooling apparatus for cooling a heat generator in electronic devices comprises:
    a flow path, in which a coolant flows, embedded in a base;

a liquid cooling pump disposed on a surface of the base for circulating the coolant;

a liquid cooling unit embedded in the base for connecting the flow path and the liquid cooling pump; and an air cooling unit member disposed on the base, wherein the liquid cooling pump and the liquid cooling unit are integrated in a single unit of a metal material, wherein the liquid cooling unit comprises a piezoelectric pump having a platy piezoelectric element as a driving source, and the coolant is circulated by the piezoelectric pump.

17. A cooling apparatus according to claim 16, wherein the piezoelectric pump comprises a stacked plate structure having a check valve of plate vane structure for controlling a flow direction of the coolant.

18. A cooling apparatus for cooling a heat generator in electronic devices comprising:

a unit for liquid cooling having a flow path in which a coolant flows and a liquid cooling pump for circulating the coolant, both of which are embedded in a base; and an air cooling unit member disposed on the base, wherein the liquid cooling unit comprises a piezoelectric pump having a platy piezoelectric element as a driving source, and the coolant is circulated by the piezoelectric pump, wherein the piezoelectric pump comprises:

a plurality of pump members for introducing and exhausting the coolant; and a plurality of piezoelectric pump driving members for driving the plurality of pump members.

19. A cooling apparatus according to claim 18, wherein the plurality of piezoelectric pump driving members control timings of introduction and exhaust of the coolant of the plurality of pump members in different timing to each other.

20. A cooling apparatus according to claim 18, wherein the piezoelectric pump driving member conducts an exhaust more than two times longer than an introduction of the pump member.

21. A cooling apparatus for cooling a heat generator in electronic devices comprising:

a unit for liquid cooling having a flow path in which a coolant flows and a liquid cooling pump for circulating the coolant, both of which are embedded in a base; and an air cooling unit member disposed on the base, wherein the liquid cooling unit comprises a piezoelectric pump having a toric piezoelectric actuator as a driving source, and the coolant is circulated by the piezoelectric pump.

22. A cooling apparatus for cooling a heat generator in electronic devices comprising:

a unit for liquid cooling having a flow path in which a coolant flows and a liquid cooling pump for circulating the coolant, both of which are embedded in a base; and an air cooling unit member disposed on the base, wherein the liquid cooling unit comprises an evaporation-method pump circulating the coolant with evaporation of the coolant by a heat generator.

23. A cooling apparatus according to claim 22, wherein the evaporation-method pump comprises a plurality of heat generators, and a flow direction of the coolant is determined by controlling heat generation timing of the plurality of heat generators.

24. A cooling apparatus for cooling a heat generator in electronic devices comprises:

an unit for liquid cooling having a flow path in which a coolant flows and a liquid cooling pump for circulating the coolant, both of which are embedded in a base; and an air cooling unit member disposed on the base, wherein the liquid cooling pump and the liquid cooling unit are integrated in a single unit of a metal material, wherein the flow path is a closed loop with a circulation method, and in a part of the closed loop, a micro channel structure having a smaller cross section area than a cross section area of the flow path is formed.

25. The cooling apparatus of claim 24, wherein the liquid pump is built into the cooling unit.

* * * * *

UNITED STATES PATENT AND TRADEMARK OFFICE
CERTIFICATE OF CORRECTION

PATENT NO. : 7,420,807 B2 Page 1 of 1
APPLICATION NO. : 10/524770
DATED : September 2, 2008
INVENTOR(S) : Kazuyuki Mikubo et al.

It is certified that error appears in the above-identified patent and that said Letters Patent is hereby corrected as shown below:

Title page Item [86] § 371 (c)(1), (20, (4) Date: change "February 15, 2005" to -- February 16, 2005 --

Signed and Sealed this

Ninth Day of June, 2009

JOHN DOLL
*Acting Director of the United States Patent and Trademark Office*